US011939691B2

(12) United States Patent
Yamaguchi et al.

(10) Patent No.: US 11,939,691 B2
(45) Date of Patent: Mar. 26, 2024

(54) TIN OR TIN ALLOY ELECTROPLATING BATH, AND ELECTRONIC COMPONENT HAVING ELECTRODEPOSIT FORMED THEREON USING THE PLATING BATH

(71) Applicant: ISHIHARA CHEMICAL CO., LTD., Kobe (JP)

(72) Inventors: Syohei Yamaguchi, Kobe (JP); Hiroki Ishida, Kobe (JP); Masaru Hatabe, Kobe (JP); Shoya Iuchi, Kobe (JP)

(73) Assignee: ISHIHARA CHEMICAL CO., LTD., Kobe (JP)

( * ) Notice: Subject to any disclaimer, the term of this patent is extended or adjusted under 35 U.S.C. 154(b) by 242 days.

(21) Appl. No.: 16/309,088

(22) PCT Filed: Jun. 13, 2017

(86) PCT No.: PCT/JP2017/021728
§ 371 (c)(1),
(2) Date: Aug. 23, 2019

(87) PCT Pub. No.: WO2017/217387
PCT Pub. Date: Dec. 21, 2017

(65) Prior Publication Data
US 2019/0368063 A1 Dec. 5, 2019

(30) Foreign Application Priority Data
Jun. 13, 2016 (JP) .................................. 2016-117482

(51) Int. Cl.
*C25D 3/32* (2006.01)
*C25D 3/58* (2006.01)
*C25D 3/60* (2006.01)
*C25D 7/12* (2006.01)
*H01L 23/00* (2006.01)

(52) U.S. Cl.
CPC ................ *C25D 3/32* (2013.01); *C25D 3/60* (2013.01); *C25D 7/12* (2013.01); *H01L 24/11* (2013.01); *H01L 24/13* (2013.01); *H01L 2224/11462* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/1312* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2924/014* (2013.01)

(58) Field of Classification Search
CPC . C25D 3/32; C25D 3/60; C25D 3/562; C25D 3/565; C25D 3/58
USPC ........ 205/253, 302, 303, 241, 244, 245, 246
See application file for complete search history.

(56) References Cited

U.S. PATENT DOCUMENTS

| 4,168,223 | A | * | 9/1979 | Igarashi | .................... | C25D 3/60 |
| | | | | | | 205/253 |
| 4,673,470 | A | * | 6/1987 | Obata | ....................... | C25D 3/32 |
| | | | | | | 205/254 |
| 6,607,653 | B1 | * | 8/2003 | Tsuji | ......................... | C25D 3/60 |
| | | | | | | 205/241 |
| 6,776,893 | B1 | * | 8/2004 | Too | ........................... | C25D 3/38 |
| | | | | | | 205/296 |
| 7,628,903 | B1 | * | 12/2009 | Tsuji | ....................... | C25D 3/46 |
| | | | | | | 106/1.23 |
| 2003/0106802 | A1 | * | 6/2003 | Hagiwara | ................. | C25D 3/38 |
| | | | | | | 205/297 |
| 2005/0029112 | A1 | * | 2/2005 | Dietterle | .................. | C25D 3/60 |
| | | | | | | 205/252 |
| 2007/0068823 | A1 | * | 3/2007 | Takizawa | .................. | C25D 3/32 |
| | | | | | | 205/300 |
| 2011/0139626 | A1 | | 6/2011 | Saito et al. | | |
| 2014/0054175 | A1 | * | 2/2014 | Kusunoki | ................. | C25D 3/32 |
| | | | | | | 205/50 |
| 2015/0122662 | A1 | | 5/2015 | Woertink et al. | | |
| 2016/0130712 | A1 | | 5/2016 | Hori | | |

FOREIGN PATENT DOCUMENTS

| DE | 102013005499 A1 | * | 10/2013 | ............... C25D 3/46 |
| JP | H10-102276 A | | 4/1998 | |
| JP | 11021693 A | * | 1/1999 | ............... C25D 3/60 |
| JP | H11-021693 A | | 1/1999 | |
| JP | 2006265572 A | * | 10/2006 | ............... C25D 3/60 |

(Continued)

OTHER PUBLICATIONS

Notice of Reasons for Refusal, dated May 26, 2020, in Japanese Application No. 2016-117482.
International Search Report & Written Opinion, dated Jul. 11, 2017, in International Application No. PCT/JP2017/021728.
Notification of Reason For Refusal, dated Apr. 1, 2021, received in Korean Application No. 10-2019-7000888.
Office Action dated Oct. 27, 2022 in Korean Application No. 10-2019-7000888.

*Primary Examiner* — Edna Wong
(74) *Attorney, Agent, or Firm* — Knobbe, Martens, Olson & Bear LLP

(57) ABSTRACT

An electrodeposit formed by using a tin or tin alloy plating bath containing a prescribed branched polyoxyalkylene compound, such as an alkylene oxide adduct of aliphatic monoamine or polyamine in which a plurality of oxyalkylene chains are bonded to a nitrogen atom of an amine structure in a molecule, or an alkylene oxide adduct of glycerin or polyglycerin in which oxyalkylene chains are respectively bonded to a plurality of oxygen atoms of an alcohol structure in a molecule, suppresses formation defect such as abnormal growth of the electrodeposit. The electrodeposit also improves yield from the viewpoint of quality control.

4 Claims, No Drawings

(56) References Cited

FOREIGN PATENT DOCUMENTS

| | | | | |
|---|---|---|---|---|
| JP | 4756886 B2 | * | 8/2011 | ............... C25D 3/60 |
| JP | 4968865 B1 | * | 7/2012 | ............... C25D 3/60 |
| JP | 2014-122410 A | | 7/2014 | |
| JP | 2014122410 A | * | 7/2014 | ............... C25D 3/32 |
| JP | 2015-036449 A | | 2/2015 | |
| JP | 2015036449 A | * | 2/2015 | ............... C25D 3/32 |
| JP | 2015-092022 A | | 5/2015 | |
| JP | 2015-206074 A | | 11/2015 | |
| JP | 2015206074 A | * | 11/2015 | ............... C25D 3/58 |
| JP | 2016-074963 A | | 5/2016 | |
| JP | 2017-218662 A | | 12/2017 | |
| KR | 10-2011-0017429 A | | 2/2011 | |
| KR | 10-2016-0024868 A | | 3/2016 | |
| WO | WO-2007102605 A1 | * | 9/2007 | ............. C25D 21/12 |
| WO | WO-2011113908 A1 | * | 9/2011 | ......... C08G 73/0206 |

\* cited by examiner

TIN OR TIN ALLOY ELECTROPLATING BATH, AND ELECTRONIC COMPONENT HAVING ELECTRODEPOSIT FORMED THEREON USING THE PLATING BATH

PRIORITY AND CROSS REFERENCE TO RELATED APPLICATIONS

This application is the U.S. National Stage Application under 35 U.S.C. § 371 of International Application No. PCT/JP2017/021728, filed Jun. 13, 2017, designating the U.S. and published as WO 2017/217387 A1 on Dec. 21, 2017, which claims the benefit of Japanese Patent Application No. JP 2016-117482, filed Jun. 13, 2016. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention relates to a tin or tin alloy electroplating bath, and an electronic component having an electrodeposit formed thereon using the plating bath, and provides one capable of improving the yield by suppressing abnormal precipitation of an electrodeposit, such as a shape defect in a group of precipitated bump electrodes.

BACKGROUND ART

In a case where an electrodeposit (such as a bump electrode (bump) or an electrodeposited film) is formed in an electronic component by applying electroplating, for example, on a substrate for mounting a semiconductor chip, a CSP (Chip Size/scale Package) type semiconductor component having a package substrate area with a compact size substantially equivalent to that of a semiconductor chip to be mounted on the substrate is currently used for coping with demands for a light, thin, short and small product.

For connection between a substrate and a semiconductor chip, a bump electrode is formed by filling tin or a tin alloy in a pad or a land disposed on the semiconductor chip or a pad, a land or a via conductor portion disposed on the substrate, and the semiconductor chip is provided on the thus formed bump electrode.

When the bump electrode is to be formed by filling tin or a tin alloy, a method in which a tin-based solder paste or solder ball is placed and then melted by a heat treatment, or a method in which the bump electrode is formed by electroplating is employed, and from the viewpoint of cost and miniaturization, the electroplating method is suitable.

Examples of a tin or tin alloy electroplating bath used in the formation of a bump electrode include the following:

(1) Patent Literature 1

A tin bath or a tin alloy bath of a tin-nickel alloy, a tin-copper alloy, a tin-bismuth alloy or the like, containing a sulfur-containing compound having a prescribed monocyclic heterocyclic group or a fused heterocyclic group containing one to five atoms of at least one selected from nitrogen, sulfur and oxygen, and having a sulfide group or a mercapto group adjacently bonded to the heterocyclic group (claims 1 to 3).

Since the sulfur-containing compound is contained in the tin-based plating bath, uniformity in thickness of a plating film and uniformity in alloy composition can be improved, and hence, even when a component concentration in the plating bath is changed, the thickness and the alloy composition can be stably retained (paragraphs 14, 22 and 86).

(2) Patent Literature 2

A tin bath or a tin alloy bath of a tin-copper alloy, a tin-silver alloy, a tin-bismuth alloy or the like containing: a crystal grain refiner containing a prescribed aromatic compound (such as cinnamic acid, cinnamaldehyde or benzylideneacetone) in which a hydrocarbon chain having both a double bond and an aldehyde or a carboxyl group is bonded to a benzene ring or in which an aldehyde, carboxyl group or the like is bonded to a pyridine ring; and a prescribed nonionic surfactant containing an ethylene oxide (EO)/propylene oxide (PO) adduct of ethylenediamine (claims 1 to 3 and paragraphs 18 to 19 and 21 to 23).

When this plating bath is used, a tin-based solder layer such as a solder bump having good within-die uniformity or a cap on a copper pillar can be deposited (paragraphs 7, 42 and 50 to 52).

CITATION LIST

Patent Literature

[Patent Literature 1] Japanese Laid-Open Patent Publication No. 2014-122410

[Patent Literature 2] Japanese Laid-Open Patent Publication No. 2015-092022

SUMMARY

When a chip component such as an LSI or an IC is to be provided on a large number of bump electrodes formed on a substrate, it is significant to obtain uniformity in shape of the bump electrodes, particularly in height, for definitely assuring connection to the chip component. This also applies to board to board connection for connecting substrates to each other via a bump electrode formed on a land.

When a group of a large number of fine bump electrodes are formed by using the tin or tin alloy plating bath described in the above-described patent literatures, however, a shape defect that merely a small number of electrodes are formed in an unexpectedly abnormally large or small size, or a failure of occurrence of an unplated phenomenon resulting in failing to form an electrode in some cases occur although the probability is low.

In accordance with recent increase of the number of electrodes, such a harmful effect has become further conspicuous, and the yield is more likely to be lowered from the viewpoint of quality control.

A technical problem of the present invention is, regarding an electrodeposit formed by using a tin or tin alloy electroplating bath, to suppress formation defect such as abnormal growth particularly when a group of a large number of fine bump electrodes are precipitated.

The present applicant has precedently proposed, in Japanese Patent Application No. 2015-149883 (hereinafter referred to as the prior invention), that variation in height of electrodeposits is suppressed by using a tin or tin alloy plating bath containing a crosslinked aromatic compound, such as benzyl phenyl disulfonate, alkyl diphenyl ether disulfonate or diphenylamine disulfonate, having, as a basic skeleton, a structure in which aromatic rings or heterocyclic rings are bonded to each other via a specific type of bond such as an ether bond, an alkylene bond or an imino bond.

From a starting point of this prior invention, the present inventors have found, through a process of trial and error using compounds different from the crosslinked aromatic compound, that formation defect such as abnormal growth can be smoothly suppressed, even when, for example, a group of a large number of fine bump electrodes are precipitated, by using, in a tin or tin alloy bath, a branched polyoxyalkylene compound having a basic skeleton including alkylene oxide added to an amine structure or an alcohol structure, and thus, the present invention has been accomplished.

A present invention 1 is a tin or tin alloy electroplating bath, containing:
(A) a soluble salt of a stannous salt or a mixture of a stannous salt and a salt of a metal selected from zinc, nickel, bismuth, cobalt, indium, antimony, gold, silver, copper and lead;
(B) an acid or a salt thereof; and
(C) a branched polyoxyalkylene compound selected from the group consisting of the following compounds (C1), (C2), (C3), (C4) and (C5):
[(C1) an alkylene oxide adduct of aliphatic monoamine in which a plurality of oxyalkylene chains are bonded to a nitrogen atom of an amine structure in a molecule;
(C2) an alkylene oxide adduct of aliphatic polyamine in which a plurality of oxyalkylene chains are bonded to at least one nitrogen atom of an amine structure in a molecule (noting that an ethylene oxide/propylene oxide adduct of ethylenediamine is excluded);
(C3) an alkylene oxide adduct of trimethylolalkane or triethylolalkane in which oxyalkylene chains are respectively bonded to a plurality of oxygen atoms of an alcohol structure in a molecule;
(C4) an alkylene oxide adduct of glycerin in which oxyalkylene chains are respectively bonded to a plurality of oxygen atoms of an alcohol structure in a molecule; and
(C5) an alkylene oxide adduct of polyglycerin in which oxyalkylene chains are respectively bonded to a plurality of oxygen atoms of an alcohol structure in a molecule].

A present invention 2 is the tin or tin alloy electroplating bath according to the present invention 1, in which,
regarding the branched polyoxyalkylene compound (C),
the compound (C1) is at least one selected from polyoxyethylene laurylamine, polyoxyethylene polyoxypropylene laurylamine, polyoxyethylene polyoxypropylene stearylamine and polyoxyethylene polyoxypropylene oleylamine,
the compound (C2) is at least one selected from polyoxyethylene stearylpropylenediamine, propylenediamine polyoxyethylene polyoxypropylene, propylenediamine polyoxyethylene, propylenediamine polyoxypropylene, ethylenediamine polyoxyethylene and ethylenediamine polyoxypropylene,
the compound (C3) is trimethylolpropane tripolyoxyethylene ether,
the compound (C4) is polyoxypropylene glycerol ether, and
the compound (C5) is polyoxypropylene polyglyceryl ether.

A present invention 3 is the tin or tin alloy electroplating bath according to the present invention 1 or 2, further containing:
at least one complexing agent (D) selected from a sulfide compound selected from the following compound (a), compound (b) and compound (c); a heterocyclic sulfur-containing compound corresponding to the following compound (d); oxycarboxylic acid; polycarboxylic acid; aminocarboxylic acid; pyrophosphoric acid; polyamine; amino alcohol; and salts thereof:

[(a) an aliphatic sulfide compound represented by the following formula (a):

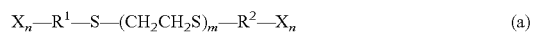

$$X_n\text{—}R^1\text{—}S\text{—}(CH_2CH_2S)_m\text{—}R^2\text{—}X_n \qquad (a)$$

in which $R^1$ and $R^2$ are C2-C4 alkylene; X is selected from OH, $SO_3H$, $SO_3M$ (in which M is an alkali metal, ammonia or amine), $NR^aR^b$ (in which $R^a$ and $R^b$ are hydrogen or C1-C6 alkyl), and $CONR^aR^b$ (in which $R^a$ and $R^b$ are hydrogen or C1-C6 alkyl), and may be bonded to any carbon atom in an alkylene chain included in $R^1$ and $R^2$; m is an integer of 1 to 2; and n is an integer of 1 to 4;

(b) an aliphatic sulfide compound represented by the following formula (b):

$$H\text{—}(OA)_n\text{-}S\text{—}(OA)_n\text{-}H \qquad (b)$$

in which A is ethylene or propylene (with a hydroxyl group optionally bonded to a carbon atom included in an ethylene or propylene chain); and n is an integer of 1 to 25;

(c) an aromatic sulfide compound having one or repeated mono-, di- or trisulfide bond, and having one or more basic nitrogen atoms in at least one of atom groups disposed on both sides of the bond and selected from aliphatic, alicyclic, aromatic ring and heterocyclic atoms; and (d) a heterocyclic sulfur-containing compound that has a monocyclic heterocyclic group or a fused heterocyclic group containing 1 to 5 atoms of at least one selected from nitrogen, sulfur and oxygen, (noting that pyridine, morpholine, benzimidazole, benzothiazole and benzoxazole ring groups are excluded, and the monocyclic heterocyclic group or the fused heterocyclic group is any one of heterocyclic groups selected from tetrazole, triazole, thiazole, thiadiazole, imidazole, quinoline, furan, morpholine, thiophen, pyridine, oxazole, oxadiazole, pyrrole, pyrazole, pyrazine, isothiazole, isoxazole, pyrazolidine, pyrimidine, pyridazine, pyrrolidine, indolizine, indole, isoindole, indazole, purine, isoquinoline, naphthyridine, quinoxaline, carbazole, phenanthroline, phenazine, phenothiazine, phenoxazine, phenanthridine, pyrroline, imidazolidine, pyrazoline, imidazoline, piperidine, piperazine, indoline and thianthrene), and that has a sulfide group or a mercapto group bonded adjacently to the heterocyclic group].

A present invention 4 is a tin or tin alloy electroplating bath, containing:
(A) a soluble salt of a stannous salt or a mixture of a stannous salt and a salt of a metal selected from zinc, nickel, bismuth, cobalt, indium, antimony, gold, silver, copper and lead;
(B) an acid or a salt thereof;
(C) an ethylene oxide/propylene oxide adduct (C21) of ethylenediamine; and
(D) at least one complexing agent selected from a sulfide compound selected from the following compound (b) and compound (c); a heterocyclic sulfur-containing compound corresponding to the following compound (d1); oxycarboxylic acid; polycarboxylic acid; aminocarboxylic acid; pyrophosphoric acid; polyamine; amino alcohol; and salts thereof:

[(b) an aliphatic sulfide compound represented by the following formula (b):

$$H\text{—}(OA)_n\text{-}S\text{—}(OA)_n\text{-}H \qquad (b)$$

in which A is ethylene or propylene (with a hydroxyl group optionally bonded to a carbon atom included in an ethylene or propylene chain); and n is an integer of 1 to 25;

(c) an aromatic sulfide compound having one or repeated mono-, di- or trisulfide bond, and having one or more basic nitrogen atoms in at least one of atom groups disposed on both sides of the bond and selected from aliphatic, alicyclic, aromatic ring and heterocyclic atoms; and (d1) a heterocyclic sulfur-containing compound that has a monocyclic heterocyclic group or a fused heterocyclic group containing 1 to 5 atoms of at least one selected from nitrogen, sulfur and oxygen, (noting that pyridine, morpholine, benzimidazole, benzothiazole and benzoxazole ring groups are excluded, and the monocyclic heterocyclic group or the fused heterocyclic group is any one of heterocyclic groups selected from triazole, thiazole, thiadiazole, imidazole, quinoline, furan, morpholine, thiophen, pyridine, oxazole, oxadiazole, pyrrole, pyrazole, pyrazine, isothiazole, isoxazole, pyrazolidine, pyrimidine, pyridazine, pyrrolidine, indolizine, indole, isoindole, indazole, purine, isoquinoline, naphthyridine, quinoxaline, carbazole, phenanthroline, phenazine, phenothiazine, phenoxazine, phenanthridine, pyrroline, imidazolidine, pyrazoline, imidazoline, piperidine, piperazine, indoline and thianthrene), and that has a sulfide group or a mercapto group bonded adjacently to the heterocyclic group].

A present invention 5 is the tin or tin alloy electroplating bath according to any one of the present inventions 1 to 4, further containing at least one additive selected from a surfactant, an antioxidant, a brightening agent, a semi-brightening agent, a pH adjusting agent and an antifoaming agent.

A present invention 6 is an electronic component, in which an electrodeposit made of a material of tin or a tin alloy is formed, by using the tin or tin alloy electroplating bath according to any one of the present inventions 1 to 5, on any one selected from a glass substrate, a silicon substrate, a sapphire substrate, a wafer, a printed wiring board, a semiconductor integrated circuit, a resistor, a variable resistor, a capacitor, a filter, an inductor, a thermistor, a crystal oscillator, a switch, a lead wire and a solar cell.

According to the present invention, a prescribed branched polyoxyalkylene compound is contained in a tin or tin alloy electroplating bath, and therefore, formation defect such as abnormal growth is suppressed when a large number of electrodeposits (such as a bump electrode and an electrodeposited film) are formed by electroplating, and thus, improvement of the yield can be satisfactorily assured from the viewpoint of quality control.

Besides, when a specific type of a complexing agent such as a sulfide compound or a heterocyclic sulfur compound is additionally added to the tin or tin alloy electroplating bath of the present invention, stability of the plating bath can be improved so as to further effectively suppress the abnormal growth and the like.

In particular, when a group of a large number of fine bump electrodes are formed by using the tin or tin alloy electroplating bath of the present invention, although there are not a few cases of a shape defect that merely a small number of electrodes are formed in an unexpectedly abnormally large or small size, or a failure of occurrence of an unplated phenomenon in employing conventional techniques, the occurrence of such a defect can be smoothly suppressed when the tin or tin alloy electroplating bath of the present invention is applied.

Besides, the application of the tin or tin alloy electroplating bath of the present invention is not limited to the formation of a bump electrode, and in application to formation of an electrodeposited film, formation defect is also suppressed so that a uniform electrodeposit can be provided, and for example, in filling in a via hole or the like in a substrate, a good and homogeneous tin-based material can be filled without forming a void.

Incidentally, Patent Literature 2 mentioned above discloses that the tin or tin alloy electroplating bath contains a prescribed nonionic surfactant containing an EO/PO adduct of ethylenediamine together with a crystal grain refiner such as cinnamic acid or benzylideneacetone.

In Examples 1 and 2 (paragraphs 53 and 55) of Patent Literature 2, a tin-silver alloy plating bath containing benzylideneacetone (a crystal grain refiner), an EO/PO adduct of ethylenediamine (a nonionic surfactant), dithiaalkyldiol (a first complexing agent for silver ions) and a mercaptotetrazole derivative (a second complexing agent for silver ions) is disclosed.

Incidentally, although a PO adduct or an EO adduct of ethylenediamine is described in Examples 28 to 29 below, an alkylene oxide adduct using either one of EO and PO is presumed to be different from the alkylene oxide adduct multiply containing both EO and PO described in claim 1 of Patent Literature 2.

DETAILED DESCRIPTION

The present invention is firstly a tin or tin alloy electroplating bath containing a branched polyoxyalkylene compound basically having a structure in which a plurality of oxyalkylene chains are bonded to at least one nitrogen atom of an amine structure in a molecule, or oxyalkylene chains are respectively bonded to a plurality of oxygen atoms of an alcohol structure in a molecule, and secondly an electronic component having an electrodeposit (a bump electrode or an electrodeposited film) formed thereon by using the electroplating bath.

First, the tin or tin alloy electroplating bath of the present invention 1 will be described.

The tin plating bath contains (A) a soluble stannous salt, (B) an acid or a salt thereof, and (C) a branched polyoxyalkylene compound.

The tin alloy plating bath contains (A) a soluble salt of a mixture of a stannous salt and a salt of a metal selected from zinc, nickel, bismuth, cobalt, indium, antimony, gold, silver, copper and lead, (B) an acid or a salt thereof, and (C) a branched polyoxyalkylene compound.

The tin or tin alloy plating bath of the present invention 1 is characterized by containing the branched polyoxyalkylene compound (C), which refers to any one of the following compounds (C1) to (C5):

(C1) An alkylene oxide adduct of aliphatic monoamine in which a plurality of oxyalkylene chains are bonded to a nitrogen atom of an amine structure in a molecule;

(C2) an alkylene oxide adduct of aliphatic polyamine in which a plurality of oxyalkylene chains are bonded to at least one nitrogen atom of an amine structure in a molecule (noting that an ethylene oxide/propylene oxide adduct of ethylenediamine is excluded);

(C3) an alkylene oxide adduct of trimethylolalkane or triethylolalkane in which oxyalkylene chains are respectively bonded to a plurality of oxygen atoms of an alcohol structure in a molecule;

(C4) an alkylene oxide adduct of glycerin in which oxyalkylene chains are respectively bonded to a plurality of oxygen atoms of an alcohol structure in a molecule; and (C5) an alkylene oxide adduct of polyglycerin in which oxyalkylene chains are respectively bonded to a plurality of oxygen atoms of an alcohol structure in a molecule.

Each of the compounds (C1) to (C5) needs to have a branched structure, and for example, in a case of the alkylene oxide adduct (C1) of an aliphatic monoamine, even when one oxyalkylene chain is bonded to a nitrogen atom of an amine structure in a molecule, the resultant is a straight chain molecule as a whole and cannot be said to have a branched structure, and therefore, for application to the compound (C1) to be used in the present invention, it is necessary that oxyalkylene chains are respectively bonded to two bonding hands extending from a nitrogen atom of an amine structure in a molecule so as to form a branched structure in this bonding portion (namely, two oxyalkylene chains are branched at the nitrogen atom).

This also applied to the other compounds (C2) to (C5).

Besides, each of the aliphatic monoamine and the aliphatic polyamine is not limited to a single compound but may be a mixture. Examples of a mixture of a large number of the monoamines include alkylamines and esteramines based on natural fats and oils such as coconut oil, beef tallow, palm kernel oil and castor oil. In this case, as the alkylene oxide adduct (C1) of aliphatic monoamine, a compound in which ethylene oxide and/or propylene oxide is added to C8-C18 alkylamine (or esteramine) is preferred as described below. In this case, when an alkylamine (or an esteramine) based on any of the natural fats and oils is selected, the C8-C18 alkylamines (or esteramines) are mixedly present therein, and thus, a mixture of adducts of these monoamines can be obtained.

On the other hand, the branched polyoxyalkylene compound (C) is added for suppressing formation defect such as abnormal growth of a tin or tin alloy film precipitated from the plating bath, and polyoxyethylene/polyoxypropylene glycol having a content of polyoxyethylene of 40% or less and a high addition ratio of propylene oxide, namely, a specific Pluronic surfactant, can be expected to be effective as an agent for suppressing the abnormal growth or the like. An example of the specific Pluronic surfactant includes, as described in Examples 9 and 12 below, polyoxyethylene polyoxypropylene glycol (EO 15 mol/PO 35 mol).

Among the branched polyoxyalkylene compounds (C) described above, the compound (C1) has a structure in which oxyalkylene chains are respectively bonded to two bonding hands of a nitrogen atom of the aliphatic monoamine.

The alkylene oxide means either ethylene oxide (EO) or propylene oxide (PO), and either one of EO and PO may be added to the aliphatic monoamine, or both EO and PO may be added thereto. When both of these are added, they may be added in the form of a block, or may be randomly added. When block addition is employed, for example, EO may be precedently added to a nitrogen atom of an amine structure, or PO may be precedently added.

Such addition form of alkylene oxide also applies to the compounds (C2) to (C5).

Next, with regard to the alkylene oxide adduct (C2) of aliphatic polyamine, when the aliphatic polyamine is another type of aliphatic polyamine excluding ethylenediamine, such as diethylenetriamine, triethylenetetramine, tetraethylenepentamine or propylenediamine, alkylene oxide adducts of such another type of aliphatic polyamine are all embraced.

On the other hand, when the aliphatic polyamine is ethylenediamine, although an ethylene oxide adduct (an adduct of EO alone) of ethylenediamine and a propylene oxide adduct (an adduct of PO alone) of ethylenediamine are embraced in the compound (C2), an ethylene oxide/propylene oxide adduct (a multiple adduct of both EO and PO) of ethylenediamine is excluded.

Therefore, as an addition form of the compound (C2), a structure in which oxyalkylene chains are respectively bonded to two bonding hands of one nitrogen atom or each of a plurality of nitrogen atoms of the aliphatic polyamine is employed.

For example, when the aliphatic polyamine is propylenediamine, ethylenediamine or the like, oxyalkylene chains may be respectively bonded to two bonding hands extending from one nitrogen atom, or oxyalkylene chains may be respectively bonded to two bonding hands extending from each of two nitrogen atoms.

Besides, when alkylene oxide is added to a nitrogen atom of the aliphatic polyamine, in addition to the structure in which alkylene oxide is added to a nitrogen atom, a structure in which an alkylene group is disposed between a nitrogen atom and an oxyalkylene chain, specifically, alkylene oxide is added to a carbon atom at the end of an alkylene group disposed to a nitrogen atom, may be employed. For example, alkylene oxide may be added to a nitrogen atom of stearyl propylenediamine, that is, alkyl aliphatic polyamine In this case, a C18 alkylene chain is disposed between a nitrogen atom and an alkylene oxide chain.

When trimethylolalkane is, for example, trimethylolpropane ($CH_3CH_2C(CH_2OH)_3$), the compound (C3) has a structure in which oxyalkylene chains are respectively bonded to one bonding hand extending from each of two or three oxygen atoms of an alcohol structure of trimethylolpropane (namely, OH of methylol). Instead of trimethylolalkane, a plurality of oxyalkylene chains may be bonded to triethylolalkane.

The compound (C4) has a structure in which oxyalkylene chains are respectively bonded to one bonding hand extending from each of two or three oxygen atoms of an alcohol structure of glycerin.

The compound (C5) has a structure in which oxyalkylene chains are respectively bonded to one bonding hand extending from each of two or more oxygen atoms of an alcohol structure in each glycerin unit contained in polyglycerin.

As the alkylene oxide adduct (C1) of aliphatic monoamine, a compound in which ethylene oxide and/or propylene oxide is added to C8-C18 alkylamine, namely, polyoxyethylene alkyl (C8-C18) amine, polyoxyethylene polyoxypropylene alkyl (C8-C18) amine or the like, is preferred. Specific examples include polyoxyethylene laurylamine, polyoxypropylene laurylamine, polyoxyethylene polyoxypropylene laurylamine, polyoxyethylene octylamine, polyoxypropylene octylamine, polyoxyethylene polyoxypropylene octylamine, polyoxyethylene dodecylamine, polyoxypropylene dodecylamine, polyoxyethylene polyoxypropylene dodecylamine, polyoxyethylene stearylamine, polyoxypropylene stearylamine, polyoxyethylene polyoxypropylene stearylamine, polyoxyethylene oleylamine, polyoxypropylene oleylamine, polyoxyethylene polyoxypropylene oleylamine, polyoxyethylene cetylamine, polyoxypropylene cetylamine, polyoxyethylene polyoxypropylene cetylamine, polyoxyethylene butylamine, polyoxypropylene butylamine, polyoxyethylene polyoxypropylene butylamine, polyoxyethylene polyoxypropylene coconut oil alkylamine, and polyoxyethylene polyoxypropylene beef tallow alkylamine.

As the alkylene oxide adduct (C2) of aliphatic polyamine, a compound in which ethylene oxide and/or propylene oxide is added to C8-C18 alkylamine, namely, polyoxyethylene alkyl (C8-C18) amine, polyoxyethylene polyoxypropylene alkyl (C8-C18) amine or the like, is preferred. Specific examples include polyoxyethylene stearylpropylenediamine, polyoxypropylene stearylpropylenediamine, polyoxyethylene polyoxypropylene stearylpropylenediamine, ethylenediamine polyoxyethylene, ethylenediamine polyoxypropylene, propylenediamine polyoxyethylene, propylenediamine polyoxypropylene and propylenediamine polyoxyethylene polyoxypropylene.

Examples of the alkylene oxide adduct (C3) of trimethylolalkane include trimethylolpropane tripolyoxyethylene ether, trimethylolpropane tripolyoxypropylene ether and trimethylolpropane tripolyoxyethylene polyoxypropylene ether.

Examples of the alkylene oxide adduct (C4) of glycerin include polyoxyethylene glycerol ether, polyoxypropylene glycerol ether and polyoxyethylene polyoxypropylene glycerol ether.

Examples of the alkylene oxide adduct (C5) of polyglycerin include polyoxyethylene polyglyceryl ether, polyoxypropylene polyglyceryl ether and polyoxyethylene polyoxypropylene polyglyceryl ether.

As the branched polyoxyalkylene compound (C), polyoxyethylene laurylamine, polyoxyethylene polyoxypropylene laurylamine, polyoxyethylene polyoxypropylene stearylamine, polyoxyethylene polyoxypropylene oleylamine, polyoxyethylene polyoxypropylene coconut oil alkylamine, polyoxyethylene polyoxypropylene beef tallow alkylamine, ethylenediamine polyoxyethylene polyoxypropylene, ethylenediamine polyoxypropylene, ethylenediamine polyoxyethylene polyoxypropylene, propylenediamine polyoxyethylene, propylenediamine polyoxyethylene polyoxypropylene, polyoxypropylene glycerol ether and polyoxypropylene polyglyceryl ether are preferred.

Since the structure of the branched polyoxyalkylene compound (C) is not complicated, a commercially available product can be easily obtained.

A single one of or two or more of the branched polyoxyalkylene compounds (C) can be used, and a content in the tin or tin alloy plating bath is 0.00001 g/L to 200 g/L, preferably 0.001 g/L to 100 g/L, and more preferably 0.01 g/L to 50 g/L. When the content is smaller than these appropriate ranges, the effect of suppressing abnormal growth is degraded, and also when the content exceeds the appropriate ranges, it is apprehended that appearance defect of a plating film may be caused, and in addition, the cost is wasted.

In the tin or tin alloy plating bath of the present invention, the soluble stannous salt (A) is basically a tin salt of an organic acid or an inorganic acid generating $Sn^{2+}$ in water, and specific examples include stannous sulfate, stannous acetate, stannous borofluoride, stannous sulfamate, stannous pyrophosphate, stannous chloride, stannous gluconate, stannous tartrate, stannous oxide, sodium stannate, potassium stannate, stannous methanesulfonate, stannous ethanesulfonate, stannous 2-hydroxyethanesulfonate, stannous 2-hydroxypropanesulfonate and stannous sulfosuccinate.

In the specific tin alloy plating bath of the present invention 1, a metal to be used in combination with tin for forming a tin alloy is selected from zinc, nickel, bismuth, cobalt, indium, antimony, gold, silver, copper and lead.

With regard to a soluble salt of the metal to be used in combination, examples of a soluble salt of, for example, silver include silver acetate, silver nitrate, silver chloride, silver oxide, silver cyanide, potassium silver cyanide, silver methanesulfonate, silver 2-hydroxyethanesulfonate and silver 2-hydroxypropanesulfonate.

Examples of a soluble salt of copper include copper sulfate, copper nitrate, copper carbonate, copper pyrophosphate, copper chloride, copper cyanide, copper borofluoride, copper sulfamate, copper methanesulfonate, copper 2-hydroxyethanesulfonate and copper 2-hydroxypropanesulfonate.

Examples of a soluble salt of bismuth include bismuth sulfate, bismuth gluconate, bismuth nitrate, bismuth oxide, bismuth carbonate, bismuth chloride, bismuth methanesulfonate and bismuth 2-hydroxypropanesulfonate.

Examples of a soluble salt of indium include indium sulfamate, indium sulfate, indium borofluoride, indium oxide, indium methanesulfonate and indium 2-hydroxypropanesulfonate.

Examples of a soluble salt of zinc include zinc oxide, zinc sulfate, zinc nitrate, zinc chloride, zinc pyrophosphate, zinc cyanide, zinc methanesulfonate, zinc 2-hydroxyethanesulfonate and zinc 2-hydroxypropanesulfonate.

Examples of a soluble salt of antimony include antimony borofluoride, antimony chloride, antimony potassium tartrate, potassium pyroantimonate, antimony tartrate, antimony methanesulfonate and antimony 2-hydroxypropanesulfonate.

Examples of a soluble salt of nickel include nickel sulfate, nickel formate, nickel chloride, nickel sulfamate, nickel borofluoride, nickel acetate, nickel methanesulfonate and nickel 2-hydroxypropanesulfonate.

Examples of a soluble salt of lead include lead acetate, lead nitrate, lead carbonate, lead borofluoride, lead sulfamate, lead methanesulfonate, lead ethanesulfonate, lead 2-hydroxyethanesulfonate and lead 2-hydroxypropanesulfonate.

Examples of a soluble salt of cobalt include cobalt sulfate, cobalt chloride, cobalt acetate, cobalt borofluoride, cobalt methanesulfonate and cobalt 2-hydroxypropanesulfonate.

A total concentration in the bath of the soluble salts of these metals is, in terms of metal salt, 1 g/L to 200 g/L, and preferably 10 g/L to 150 g/L in general.

Besides, a mixing ratio between the soluble stannous salt and the soluble salt of a metal to be used in combination for forming an alloy may be appropriately adjusted in accordance with a composition ratio of a desired tin alloy plating film.

The tin alloy of the present invention 1 is an alloy of tin and at least one metal selected from the group consisting of zinc, nickel, bismuth, cobalt, indium, antimony, gold, silver, copper and lead, and specifically embraces not only two-component alloys such as a tin-silver alloy, a tin-copper alloy, tin-bismuth, tin-indium, tin-zinc, tin-antimony, tin-nickel, tin-gold, tin-cobalt and tin-lead but also three- or more component alloys such as a tin-copper-silver alloy, a tin-copper-bismuth alloy, tin-zinc-nickel, tin-bismuth-silver, tin-bismuth-lead, tin-lead-silver, tin-indium-silver and tin-nickel-cobalt.

From the viewpoint of control of the bath, the above-described two-component tin alloys are preferred.

In the tin or tin alloy plating bath of the present invention 1, the acid or the salt thereof (B) used as a bath base is an organic acid, an inorganic acid, or an alkali metal salt, an alkaline earth metal salt, an ammonium salt, an amine salt or the like thereof.

Examples of the organic acid include organic sulfonic acids and aliphatic carboxylic acids, and examples of the inorganic acid include sulfuric acid, hydrochloric acid, fluoroboric acid, hydrofluorosilicic acid and sulfamic acid. Among these, a sulfuric acid bath is preferred, and in addition, a bath of an organic sulfonic acid or a salt thereof is preferred from the viewpoint of solubility of tin and easiness of waste water treatment.

A single one or a plurality of the acids or the salts thereof can be used, and the content thereof is 0.1 mol/L to 10 mol/L, and preferably 0.5 mol/L to 5 mol/L.

The organic sulfonic acid can be an alkanesulfonic acid, an alkanolsulfonic acid, a sulfosuccinic acid, an aromatic sulfonic acid or the like, and as the alkanesulfonic acid, one represented by a chemical formula: $C_nH_{2n+1}SO_3H$ (wherein, for example, n=1 to 11) can be used, and specific examples include methanesulfonic acid, ethanesulfonic acid, 1-propanesulfonic acid, 2-propanesulfonic acid, 1-butanesulfonic acid, 2-butanesulfonic acid and pentanesulfonic acid.

As the alkanolsulfonic acid, one represented by a chemical formula: $C_mH_{2m+1}$—CH(OH)—$C_pH_{2p}$—$SO_3H$ (wherein, for example, m=0 to 6 and p=1 to 5) can be used, and specific examples include 2-hydroxyethane-1-sulfonic acid (isethionic acid), 2-hydroxypropane-1-sulfonic acid (2-propanolsulfonic acid), 3-hydroxypropane-1-sulfonic acid, 2-hydroxybutane-1-sulfonic acid and 2-hydroxypentane-1-sulfonic acid, as well as 1-hydroxypropane-2-sulfonic acid, 4-hydroxybutane-1-sulfonic acid and 2-hydroxyhexane-1-sulfonic acid.

The aromatic sulfonic acid is basically benzenesulfonic acid, alkylbenzenesulfonic acid, phenolsulfonic acid, naphthalenesulfonic acid, alkylnaphthalenesulfonic acid, naphtholsulfonic acid or the like, and specific examples include 1-naphthalenesulfonic acid, 2-naphthalenesulfonic acid, toluenesulfonic acid, xylenesulfonic acid, p-phenolsulfonic acid, cresol sulfonic acid, sulfosalicylic acid, nitrobenzenesulfonic acid, sulfobenzoic acid and diphenylamine-4-sulfonic acid.

As the organic sulfonic acid, methanesulfonic acid, ethanesulfonic acid, 2-propanolsulfonic acid, 2-hydroxyethanesulfonic acid or the like is preferred.

Besides, the carboxylic acid refers to monocarboxylic acid, polycarboxylic acid, oxycarboxylic acid, aminocarboxylic acid and the like.

The tin or tin alloy electroplating bath of the present invention 1 preferably further contains a complexing agent (D) selected from a specific sulfide compound, a specific heterocyclic sulfur-containing compound, oxycarboxylic acid, polycarboxylic acid, aminocarboxylic acid, pyrophosphoric acid, polyamine, amino alcohol and salts thereof.

Firstly, the complexing agent (D) has a function, for the tin alloy plating bath, to stabilize, in the bath, various metal ions of the metals used in combination with tin for forming alloys, such as silver, copper, zinc and bismuth, to cause a eutectoid reaction with tin. In this case, such stabilization of the plating bath accelerates the function to suppress abnormal precipitation of a tin alloy-based electrodeposit.

Secondly, the tin or tin alloy electroplating bath of the present invention is applicable to an arbitrary pH region such as an acidic region or a neutral (including a weakly acidic) region, and a stannous ion is basically stable in an acidic region but easily forms white precipitation in the vicinity of a neutral region, and therefore, the complexing agent (D) has a function to stabilize $Sn^{2+}$ in the vicinity of the neutral region.

Among the complexing agents (D), the specific sulfide compound is expected to have the first function when used in a tin alloy plating bath of a tin-silver alloy, a tin-copper alloy, a tin-gold alloy, a tin-bismuth alloy or the like.

On the other hand, the complexing agent (D) selected from oxycarboxylic acid, polycarboxylic acid, aminocarboxylic acid, pyrophosphoric acid, polyamine, amino alcohol and salts of these is expected to have the first function in a tin alloy plating bath of a tin-zinc alloy, a tin-nickel alloy, a tin-cobalt alloy, a tin-indium alloy or the like, and have the second function in a tin plating bath and all the tin alloy plating baths.

When the complexing agent (D) is oxycarboxylic acid, polycarboxylic acid, aminocarboxylic acid, pyrophosphoric acid or a salt of any of these, however, the acid or the salt thereof (B) used as the base component of the plating bath can also work as the complexing agent (D). In other words, in a plating bath of the present invention adjusted to be in the vicinity of a neutral region, oxycarboxylic acid, polycarboxylic acid, aminocarboxylic acid, pyrophosphoric acid or a salt of any of these functions not only as the base component of the bath but also as the complexing agent.

For example, gluconic acid of Example 21, gluconate of Example 24, citric acid of Example 31 and pyrophosphoric acid of Example 37 described below as plating baths in the vicinity of the neutral region correspond to such use for the both functions.

The complexing agent (D) containing the sulfide compound is selected from compounds (a) to (c) as described above.

It is noted that the compound (a) is represented by the following formula (a):

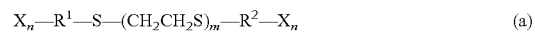

$$X_n—R^1—S—(CH_2CH_2S)_m—R^2—X_n \qquad (a)$$

In the formula (a), $R^1$ and $R^2$ are C2-C4 alkylene; X is selected from OH, $SO_3H$, $SO_3M$ (wherein M is an alkali metal, ammonia or amine), $NR^aR^b$ (wherein $R^a$ and $R^b$ are hydrogen or C1-C6 alkyl) and $CONR^aR^b$ (wherein $R^a$ and $R^b$ are hydrogen or C1-C6 alkyl) and may be bonded to any carbon atom of an alkylene chain included in $R^1$ and $R^2$; m is an integer of 1 to 2; and n is an integer of 1 to 4.

The compound (b) is represented by the following formula (b):

$$H—(OA)_n\text{-}S—(OA)_n\text{-}H \qquad (b)$$

In the formula (b), A is ethylene or propylene (with a hydroxyl group optionally bonded to a carbon atom included in an ethylene or propylene chain); and n is an integer of 1 to 25.

Among these, the sulfide compound represented by the formula (a) is a thiaalkane-type aliphatic sulfide compound, and examples include 3,6-dithiaoctane-1,8-diol, 3,6,9-trithiaundecane-1,11-diol, 4,7-dithiadecane-1,10-diol, 4,7-dithiadecane-1,2,9,10-tetraol, 4,7,10-trithiatridecane-1,13-diol, 4,7-dithiadecane-1,10-disulfonic acid, 5,8-dithiadodecane-1,12-disulfonic acid, 3,6-dithiaoctane-1,8-disulfonic acid, 5,8,11-trithiapentadecane-1,15-disulfonic acid, 1,8-diamino-3,6-dithiaoctane, 1,11-bis(methylamino)-3,6,9-trithiaundecane, 1,14-bis(methylamino)-3,6,9,12-tetrathiatetradecane, 1,10-diamino-4,7-dithiadecane, 4,7-dithiadiethoxy ether, 6,9-dithiatetradecane-6,9-diethoxy-1,14-diol, and salts (Na, K, amine and ammonium) of these.

Preferable examples are 3,6-Dithiaoctane-1,8-diol, 4,7-dithiadecane-1,10-diol, 1,10-diamino-4,7-dithiadecane, 3,6-dithiaoctane-1,8-disulfonic acid, 1,8-diamino-3,6-dithiaoctane, 4,7-dithiadecane-1,2,9,10-tetraol and the like.

In this case, when $R^1$ and $R^2$ are both ethylene, X is OH and the addition number m is 1 in the formula (a), a corresponding compound means 3,6-dithiaoctane-1,8-diol represented by a chemical formula: HO—CH$_2$CH$_2$—S—CH$_2$CH$_2$S—CH$_2$CH$_2$—OH.

When R$^1$ and R$^2$ are both propylene, X is OH and the addition number m is 1, the corresponding compound means 4,7-dithiadecane-1,10-diol (see Examples 5, 9 and 14 described below) represented by a chemical formula: HO—CH$_2$CH$_2$CH$_2$—S—CH$_2$CH$_2$S—CH$_2$CH$_2$CH$_2$—OH.

When R$^1$ and R$^2$ are both propylene, X is SO$_3$Na and the addition number m is 2, the corresponding compound means sodium 4,7,10-trithiatridecane-1,13-disulfonate represented by a chemical formula: NaO$_3$S—CH$_2$CH$_2$CH$_2$—S—(CH$_2$CH$_2$S)$_2$—CH$_2$CH$_2$CH$_2$—SO$_3$Na.

When R'=R$^2$=CH$_2$CH$_2$, X=NH$_2$ and m=1, the corresponding compound is represented by a chemical formula: H$_2$N—CH$_2$CH$_2$—S—CH$_2$CH$_2$—S—CH$_2$CH$_2$—NH$_2$ (1,8-diamino-3,6-dithiaoctane).

When R$^1$=R$^2$=CH$_2$CH$_2$, X=NHCH$_3$ and m=3, the corresponding compound is represented by a chemical formula:

CH$_3$HN—CH$_2$CH$_2$—S—CH$_2$CH$_2$—S—CH$_2$CH$_2$—
S—CH$_2$CH$_2$—S—CH$_2$CH$_2$—NHCH$_3$ (1,14-bis(methylamino)-3,6,9,12-tetrathiatetradecane).

Besides, in the formula (a), the substituent X of OH or SO$_3$H bonding to a C2-C4 alkylene chain of R$^1$ or R$^2$ may be bonded to any carbon atom in the alkylene chain, and one such substituent X is bonded to the end of the alkylene chain in general, but a compound having a structure in which one OH group each, namely, two in total, (that is, n=2 in the formula (a)) is bonded to each of carbon atoms in positions 1 and 2 of a propylene chain (namely, R$^1$ or R$^2$ in the formula (a) is a C3 alkylene chain) is also embraced in the thiaalkane-type aliphatic sulfide compound represented by the formula (a).

Besides, the sulfide compound represented by the formula (b) is an oxyalkylene-type aliphatic sulfide compound, and examples include thiobis(pentaethylene glycol), thiobis(hexaethylene glycol), thiobis(octaethylene glycol), thiobis(decaethylene glycol), thiobis(undecaethylene glycol), thiobis(dodecaethylene glycol), thiobis(tridecaethylene glycol), thiobis(tetradecaethylene glycol), thiobis(pentadecaethylene glycol), dithiobis(pentadecaethylene glycol), thiobis(eicosaethylene glycol), thiobis(triacontaethylene glycol) and thiobis(triglycerin).

Thiobis(dodecaethylene glycol), thiobis(hexaethylene glycol), thiobis(decaethylene glycol), thiobis(eicosaethylene glycol), dithiobis(pentadecaethylene glycol), thiobis(triglycerin) and the like are preferred.

In the formula (b), A is ethylene or propylene, and an addition molar ratio between an oxyethylene chain and an oxypropylene chain is not particularly limited, but the mole number of the oxyethylene chain is preferably equal to or larger than the mole number of the oxypropylene chain. Besides, the addition number n of oxyalkylene is an integer of 1 to 25, and preferably n=3 to 25, and more preferably n=10 to 20.

When A is ethylene and the addition number n is 5 in the formula (b), a corresponding compound means thiobis(pentaethylene glycol) represented by a chemical formula: H—(OCH$_2$CH$_2$)$_5$—S—(CH$_2$CH$_2$O)$_5$—H.

Besides, when A is ethylene and the addition number n is 12, the corresponding compound means thiobis(dodecaethylene glycol) represented by a chemical formula:

H—(OCH$_2$CH$_2$)$_{12}$—S—(CH$_2$CH$_2$O)$_{12}$—H.

On the other hand, an example of a compound in which a hydroxyl group is bonded to a carbon atom included in the ethylene or propylene chain A in the formula (b) includes thiobis(triglycerin).

The sulfide compound (c) is an aromatic sulfide compound, and can be represented by the following formula (c1):

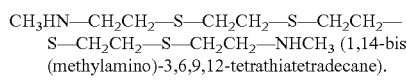 (c1)

In the formula (c1), x and y are respectively integers of 1 to 4; p is 0 or an integer of 1 to 100; and q is an integer of 1 to 100.

The aromatic sulfide compound is a compound having, in a molecule, one or repeated sulfide or disulfide bond, and having one or more basic nitrogen atoms in at least one of atom groups disposed on both sides of the bond.

In the aromatic sulfide compound, Ra and Rc indicating the atom groups represent aralkyl, cycloalkyl, polycyclic cycloalkyl, aryl, polycyclic aryl, a heterocyclic group or a polycyclic heterocyclic group, and the atom group Rb represents aralkylene, cycloalkylene, polycyclic cycloalkylene, allylene, polycyclic allylene, a heterocyclic group or a polycyclic heterocyclic group. Specific examples of the atom group include C1-C6 alkyl, C2-C6 alkenyl, C2-C6 alkynyl, a cyclopentane ring group, a cyclohexane ring group, a benzene ring group, a naphthalene ring group, a phenanthrene ring group, a pyridine ring group, a pyrrole ring group, a pyrazine ring group, a pyridazine ring group, a thiazole ring group, a thiadiazole ring group, an imidazoline ring group, an imidazole ring, a thiazoline ring group, a triazole ring, a tetrazole ring group, a picoline ring group, a furazan ring group, a piperidine ring group, a piperazine ring group, a triazine ring, a morpholine ring group, a benzothiazole ring group, a benzimidazole ring group, a quinoline ring group, a quinoxaline ring group, a pteridine ring group, a phenanthroline ring group, a phenazine ring group, an indoline ring group and a perhydroindoline ring group.

Since the bonding numbers x and y of sulfur are respectively 1 to 4, such a sulfide-based compound embraces a sulfide compound, a disulfide compound, a trisulfide compound and a tetrasulfide compound.

Besides, in the aromatic sulfide compound, the repetition number p of the atom group Rb is 0 to 100 and the repetition number q of the atom group Rc is 1 to 100.

When p=0, however, Ra and Rc positioned at the ends of the aromatic sulfide compound may be bonded to each other to form a substituted or unsubstituted monocycle or polycycle. Besides, when p=1 to 100, Ra and Rb, Ra and Rb or Rb and Rc may be bonded to each other to form a substituted or unsubstituted monocycle or polycycle, or Ra and Rb, and, Rb and Rc may be multiply bonded to each other to form a substituted or unsubstituted monocycle or polycycle.

Each of Ra, Rb and Rc may have a substituent or may be unsubstituted. Specific examples of the substituent include C1-6 alkyl, C2-6 alkenyl, C2-6 alkynyl, C1-6 alkoxy, C1-6 alkylthio, C1-6 alkoxy C1-6 alkyl, C1-6 alkylthio C1-6 alkyl, C1-6 alkylcarbonyl, C1-6 alkoxycarbonyl, amino, C1-6 alkylamino, C1-6 dialkylamino, carbamoyl, halogen, alkylsulfonyl, arylsulfonyl, alkylsulfinyl, arylsulfinyl, alkylsulfenyl, arylsulfenyl, cyano, nitro, hydroxy, carboxyl, mercapto, imino, alkylthio, arylthio, alkyldithio, aryldithio, alkyltrithio, aryltrithio, alkyltetrathio and aryltetrathio groups.

The aromatic sulfide compound will now be described referring to the formula (c1). When p=0, Ra=Rc=a pyridine ring (abbreviated as Py), y=2 and q=1, the resultant is Py-S—S-Py (dipyridyl disulfide), and has a basic nitrogen atom in each of the pyridine rings at both ends of a disulfide bond. When p=0, Ra=Rc=an aniline ring (abbreviated as An), y=1 and q=1, the resultant is An-S-An (thiodianiline), and has a basic nitrogen atom in each of the aniline rings (namely, in each of amino groups bonded to each of benzene rings) at both ends of a monosulfide bond.

When Ra=Rc=a pyridine ring (abbreviated as Py), Rc=$CH_2CH_2$, x=y=1, p=3 and q=1, the resultant is Py-$SCH_2CH_2$—$SCH_2CH_2$—$SCH_2CH_2$—S-Py (1,10-dipyridyl-1,4,7,10-tetrathiadecane), and has a basic nitrogen atom in each of the pyridine rings at both ends of a molecule.

Specific examples of the aromatic sulfide compound include the following: 2-ethylthioaniline, dithiodianiline, 2-(2-aminoethyldithio)pyridine, 2,2'-dithiadiazolyl disulfide, 5,5'-di(1,2,3-triazolyl)disulfide, 2,2'-dipyrazinyl disulfide, 2,2'-dipyridyl disulfide, 2,2'-dithiodianiline, 4,4'-dipyridyl disulfide, 2,2'-diamino-4,4'-dimethyldiphenyl disulfide, 2,2'-dipyridazinyl disulfide, 5,5'-dipyrimidinyl disulfide, 2,2'-di(5-dimethylaminothiadiazolyl)disulfide, 5,5'-di(1-methyltetrazolyl)disulfide, 2,2'-di(1-methylpyrrolyl)disulfide, 2-pyridyl-2-hydroxyphenyl disulfide, 2,2'-dipiperidyl disulfide, 2,2'-dipyridyl sulfide, 2,6-di(2-pyridyldithio)pyridine, 2,2'-dipiperazinyl disulfide, 2,2'-di(3,5-dihydroxypyrimidinyl)disulfide, 2,2'-diquinolyl disulfide, 2,2'-di{6-(2-pyridyl)}pyridyl disulfide, 2,2'-α-picolyl disulfide, 2,2'-di(8-hydroxyquinolyl)disulfide, 5,5'-dimidazolyl disulfide, 2,2'-dithiazolyl disulfide, 2-pyridyl-2-aminophenyl disulfide, 2-pyridyl-2-quinolyl disulfide, 2,2'-dithiazolynyl disulfide, 2,2'-di(4,5-diamino-6-hydroxypyrimidinyl) disulfide, 2,2'-di(6-chloropyridyl)tetrasulfide, 2,2'-dimorpholino disulfide, 2,2'-di(8-methoxyquinolyl) disulfide, 4,4'-di(3-methoxycarbonylpyridyl)disulfide, 2-pyridyl-4-methylthiophenyl disulfide, 2-pyperazyl-4-ethoxymethylphenyl disulfide, 2,2'-di{6-(2-pyridyldithio) pyridyl}disulfide, 2,2'-diquinoxalinyl disulfide, 2,2'-dipteridinyl disulfide, 3,3'-difurazanyl disulfide, 3,3'-diphenanthrolynyl disulfide, 8,8'-diquinolinyl disulfide, 1,1'-diphenandinyl disulfide, 4,4'-di(3-carboxylpyridyl) trisulfide, 2,2'-dithiazolinyl disulfide, 2,2'-dipicolyl disulfide, dimethylamino diethyl disulfide, 2,2'-diperhydroindolyl disulfide, 6-6'-diimidazo[2,1-b]thiazolyl disulfide, 2,2'-di(5-nitrobenzimidazolyl)disulfide, 2,4,6-tris(2-pyridyldithio)-1,3,5-triazine, 2-aminoethyl-2'-hydroxyethyl disulfide, di(2-pyridylthio)methane, 2,4,6-tris(2-pyridyl)-1, 3,5-trithiane, 5,5'-diamino-2,11-dithio[3,3]paracyclophane, 2,3-dithia-1,5-diazaindane, 2,4,6-trithia-3a,7a-diazaindene and 1,10-di(2-pyridyl)-1,4,7,10-tetrathiadecane.

Preferable examples of the aromatic sulfide compound include 2,2'-dithiodianiline, 2,2'-dipyridyl disulfide, 2,6-di (2-pyridyldithio)pyridine, 4,4'-dipyridyl disulfide, 2,2'-dipyridyl disulfide, 1,1'-diphenandinyl disulfide and 2,2'-dithiazolinyl disulfide.

Among the above-described complexing agents (D), the heterocyclic sulfur-containing compound (d) is a sulfur-containing compound that has a monocyclic heterocyclic group or a fused heterocyclic group containing 1 to 5 atoms of at least one selected from nitrogen, sulfur and oxygen (noting that pyridine, morpholine, benzimidazole, benzothiazole and benzoxazole ring groups are excluded, and the monocyclic heterocyclic group or the fused heterocyclic group is any one of heterocyclic groups selected from tetrazole, triazole, thiazole, thiadiazole, imidazole, quinoline, furan, morpholine, thiophen, pyridine, oxazole, oxadiazole, pyrrole, pyrazole, pyrazine, isothiazole, isoxazole, pyrazolidine, pyrimidine, pyridazine, pyrrolidine, indolizine, indole, isoindole, indazole, purine, isoquinoline, naphthyridine, quinoxaline, carbazole, phenanthroline, phenazine, phenothiazine, phenoxazine, phenanthridine, pyrroline, imidazolidine, pyrazoline, imidazoline, piperidine, piperazine, indoline and thianthrene), and that has a sulfide group or a mercapto group bonded adjacently to the heterocyclic group. The monocyclic heterocyclic group or the fused heterocyclic group contained in the sulfur-containing compound includes 1 to 5 atoms of at least one selected from nitrogen, sulfur and oxygen.

Preferable examples of the monocyclic heterocyclic group or the fused heterocyclic group include tetrazole, triazole, thiazole, thiadiazole, imidazole, quinoline, furan, morpholine, thiophen, pyridine, oxazole, oxadiazole, pyrrole, pyrazole, pyrazine, isothiazole, isoxazole, pyrazolidine, pyrimidine, pyridazine, pyrrolidine, indolizine, indole, isoindole, indazole, purine, isoquinoline, naphthyridine, quinoxaline, carbazole, phenanthroline, phenazine, phenothiazine, phenoxazine, phenanthridine, pyrroline, imidazolidine, pyrazoline, imidazoline, piperidine, piperazine, indoline and thianthrene, and more preferable examples include tetrazole, triazole, thiazole, thiadiazole, thiophen, pyridine, imidazole, quinoline, phenanthroline, imidazolidine, imidazoline and piperidine.

As described above, in a tin-copper alloy plating bath of the present invention 2, since what is called a benzazol ring group, a pyridine ring group and a morpholine ring group containing benzimidazole, benzothiazole and benzoxazole are excluded, a preferable heterocyclic group is selected, as the monocyclic or fused heterocyclic group, from heterocyclic groups excluding these.

In a tin-silver alloy plating bath of the present invention 3, a benzazol ring group and a pyridine ring group are excluded, and in a tin plating bath or a specific tin alloy plating bath excluding a tin-silver alloy and a tin-copper alloy of the present invention 1, a benzazol ring group is excluded, and a heterocyclic group is specifically selected from remaining heterocyclic groups resulting from the exclusion in the same manner as in a case of the tin-copper alloy plating bath.

In the heterocyclic sulfur-containing compound (d), a sulfide group or a mercapto group is adjacent to the monocyclic heterocyclic group or the fused heterocyclic group, but in the tin-silver alloy plating bath, a sulfide group is excluded and a mercapto group alone is adjacent to the heterocyclic group A sulfide group embraces not only monosulfide but also polysulfide, such as disulfide, trisulfide and tetrasulfide, in which 2 to 5 sulfur atoms are bonded.

In a sulfide group adjacent to the heterocyclic group, a C1-C6 alkylene group may be disposed between monosulfide or polysulfide. Also in this case, however, a group adjacent to the heterocyclic group is always a sulfide group and is not an alkylene group.

Besides, in the bond between the heterocyclic group and a sulfide group, the heterocyclic groups may be bonded adjacently on both sides of the sulfide group, or the heterocyclic group may be bonded adjacently on one side of the sulfide group with another group excluding the heterocyclic group, such as an aryl group, an alkyl group, an alkenyl group or an arylalkyl group, bonded on the other side.

To the heterocyclic group, 1 to 5 substituents, such as alkyl, alkenyl, hydroxyl, hydroxyalkyl, carboxyl, amino, an alkylamino group, halogen, a sulfonic acid group, acetyl, nitro, mercapto and an alkylsulfonic acid group, may be bonded, or the heterocyclic group may be unsubstituted.

A total concentration in the bath of the heterocyclic sulfur-containing compound (d) is preferably 0.0001 mol/L to 10 mol/L, and more preferably 0.001 mol/L to 5 mol/L.

The sulfur-containing compound used in the present invention can be synthesized by any of ordinary methods.

For example, a compound in which a monosulfide group is adjacent to a monocyclic heterocyclic group or a fused heterocyclic group can be synthesized by an ordinary method of, for example, generating a monosulfide bond by reacting sodium thiolate with a halide. Alternatively, a compound in which a disulfide group is adjacent to a monocyclic heterocyclic group or a fused heterocyclic group can be synthesized by an ordinary method of, for example, generating a disulfide bond by oxidizing a thiol compound with an oxidant such as hydrogen peroxide or iodine.

Besides, a compound in which a mercapto group is adjacent to a monocyclic heterocyclic group or a fused heterocyclic group can be synthesized by an ordinary method of, for example, reacting a halide with hydrogen sulfide in the presence of an alkali.

The heterocyclic sulfur-containing compound (d) used in the present invention can be basically obtained as a commercially available product.

Preferable specific examples of the available product include 5,5'-dithiobis(1-phenyl-1H-tetrazole), 4,4'-diimidazole disulfide, 2-mercapto-1-methylimidazole, 5-mercapto-1-methyltetrazole, (2-mercapto-4-methylthiazole-5-yl)acetic acid, 4-mercaptomorpholine, 3,3'-dithiobis-1H-1,2,4-triazole, 2,2'-dithiodipyridine, 4-mercaptoquinoline-3-sulfonic acid, 2-methyl-3-furanthiol, 2,2'-dithienyl disulfide, 2-mercaptopyridine, methyl-2-pyridyl sulfide, 2-mercapto-3-pyridine carboxylic acid, 2,2'-dithiobis(5-nitropyridine), 2-pyrimidinethiol, 1-(2-dimethylaminoethyl)-5-mercaptotetrazole, 4,6'-dimethylpyrimidine-2-thiol, 4,6'-dihydroxy-2-mercaptopyrimidine, 4,6'-diamino-2-mercaptopyrimidine, 1,3'-dithiolane-2-thione, 2-mercaptothiophene, 1,3,5-triazole-2-trithiol, 5-mercapto-1-phenyl-1H-tetrazole, 1,3,4-thiadiazole-2-thiol, 2,5-dimercapto-1,3,4-thiadiazole, 5-methylthio-1,3,4-thiadiazole-2-thiol, 1-(m-sulfophenyl)-5-mercapto-1H-tetrazole sodium, 2-mercapto-5-methyl-1,3,4-thiadiazole, 2-amino-5-mercapto-1,3,4-thiadiazole, 3,3-(trimethylenebisthio)bis[4-amino-1H-1,2,4-triazole-5(4H)-thione] and 3-(2-pyridinethio)-propanesulfonic acid.

On the other hand, examples of the complexing agent (D) selected from oxycarboxylic acid, polycarboxylic acid, aminocarboxylic acid, pyrophosphoric acid, polyamine, amino alcohol and salts thereof include citric acid, tartaric acid, malic acid, gluconic acid, glycolic acid, diglycolic acid, glucoheptonic acid, gluconolactone, gluconoheptolactone, ascorbic acid, oxalic acid, malonic acid, succinic acid, ethylenediamine, diethylenetriamine, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethylethylenediaminetriacetic acid (HEDTA), triethylenetetramine hexaacetic acid (TTHA), ethylenedioxybis(ethylamine)-N,N,N',N'-tetraacetic acid, glycines, pyrophosphoric acids, phosphonic acids such as nitrotrimethylphosphonic acid and 1-hydroxyethane-1,1-diphosphonic acid, ethanolamine, diethanolamine, triethanolamine, and salts of these.

Among these exemplified complexing agents (D), preferable examples include citric acid, tartaric acid, gluconic acid, oxalic acid, malonic acid, ethylenediaminetetraacetic acid (EDTA), diethylenetriaminepentaacetic acid (DTPA), nitrilotriacetic acid (NTA), iminodiacetic acid (IDA), hydroxyethylethylenediaminetriacetic acid (HEDTA) and triethanolamine.

Single one of or a plurality of the complexing agents (D) in the present invention selected from the aliphatic sulfide compounds, the aromatic sulfide compounds, oxycarboxylic acid, polycarboxylic acid and aminocarboxylic acid can be used.

A content of the complexing agent (D) containing the aliphatic sulfide compound or the aromatic sulfide compound in the plating bath is 0.01 g/L to 300 g/L, preferably 0.1 g/L to 200 g/L, and more preferably 0.5 g/L to 150 g/L. For example, the complexing agent is used usually in an amount of 4-fold mol to 10-fold mol with respect to a total amount of gold, bismuth, silver and copper contained therein.

A content of the complexing agent (D) containing a compound other than sulfides, such as oxycarboxylic acids, polycarboxylic acids and aminocarboxylic acids, in the plating bath is suitably 0.01 g/L to 500 g/L, preferably 0.1 g/L to 400 g/L, and more preferably 1 g/L to 300 g/L.

The tin or tin alloy electroplating bath of the present invention 1 can further contain various additives such as a surfactant, an antioxidant, a brightening agent, a semi-brightening agent, a smoothing agent, a stabilizer, a pH adjusting agent, a conductive salt, a preservative and an antifoaming agent.

The surfactant is used for purpose of improving appearance, denseness, smoothness and adhesion of a resultant plating film, and any of various surfactants including anionic, cationic, nonionic and amphoteric surfactants can be used. In particular, a nonionic surfactant is significant for forming a practical tin or tin alloy film.

Examples of the anionic surfactant include alkyl sulfates, polyoxyethylene alkyl ether sulfates, polyoxyethylene alkyl phenyl ether sulfates, alkyl benzene sulfonates and alkyl naphthalene sulfonates. Examples of the cationic surfactant include mono- to tri-alkyl amine salts, dialkyl dimethyl ammonium salt, alkyl dimethyl ethyl ammonium salt, alkyl dimethyl hydroxyethyl ammonium salt, trimethyl benzyl ammonium salt, alkyl dimethyl benzyl ammonium salt and trimethyl alkyl ammonium salt. Examples of the nonionic surfactant include agents obtained through addition condensation with 2 mol to 300 mol of ethylene oxide (EO) and/or propylene oxide (PO) to C1-C20 alkanol, phenol, naphthol, bisphenols, C1-C25 alkylphenol, arylalkylphenol, C1-C25 alkylnaphthol, C1-C25 alkoxylated phosphoric acid (phosphate), sorbitan ester, polyalkylene glycol, C1-C22 aliphatic amide and the like, and an ethylenediamine polyethoxylate-polypropoxylate block copolymer. Examples of the amphoteric surfactant include carboxy betaine, imidazoline betaine and aminocarboxylic acid.

Examples of the smoothing agent include β-naphthol, β-naphthol-6-sulfonic acid, β-naphthalenesulfonic acid, m-chlorobenzaldehyde, p-nitrobenzaldehyde, p-hydroxybenzaldehyde, (o- or p-)methoxybenzaldehyde, vanillin, (2,4- or 2,6-)dichlorobenzaldehyde, (o- or p-)chlorobenzaldehyde, 1-naphthoaldehyde, 2-naphthoaldehyde, 2(4)-hydroxy-1-naphthoaldehyde, 2(4)-chloro-1-naphthoaldehyde, 2(3)-thiophene carboxaldehyde, 2(3)-furaldehyde, 3-indolecarboxaldehyde, salicylaldehyde, o-phthalaldehyde, formaldehyde, acetaldehyde, paraldehyde, butyraldehyde, isobutyraldehyde, propionaldehyde, n-valeraldehyde, acrolein, crotonaldehyde, glyoxal, aldol, succindialdehyde, capronaldehyde, isovaleraldehyde, allylaldehyde, glutaraldehyde, 1-benzylidene-7-heptanal, 2,4-hexadienal, cinnamaldehyde, benzyl crotonaldehyde, an amine-aldehyde condensate, mesityl oxide, isophorone, diacetyl, hexanedione-3,4, acetylacetone, 3-chlorobenzylideneacetone, sub. pyridylideneacetone, sub. furfurylideneacetone, sub. thenylideneacetone, 4-(1-naphthyl)-3-buten-2-one, 4-(2-furyl)-3-buten-2-one, 4-(2-thiophenyl)-3-buten-2-one, curcumin, benzylideneacetylacetone, benzalacetone, acetophenone, (2,4- or 3,4-) dichloroacetophenone, benzylideneacetophenone, 2-cinnamylthiophene, 2-(w-benzoyl)vinylfuran, vinyl phenyl ketone, acrylic acid, methacrylic acid, ethacrylic acid, ethyl acrylate, methyl methacrylate, butyl methacrylate, crotonic acid, propylene-1,3-dicarboxylic acid, cinnamic acid, (o-, m- or p-)toluidine, (o- or p-)aminoaniline, aniline, (o- or p-)chloroaniline, (2,5- or 3,4-)chloromethylaniline, N-monomethylaniline, 4,4'-diaminodiphenylmethane, N-phenyl-(α- or β-)naphthylamine, methylbenztriazole, 1,2,3-triazine, 1,2,4-triazine, 1,3,5-triazine, 1,2,3-benztriazine, imidazole, 2-vinylpyridine, indole, quinoline, a reaction product of monoethanolamine and o-vanillin, polyvinyl alcohol, catechol, hydroquinone, resorcin, polyethylene imine, disodium ethylenediamine tetraacetate and polyvinylpyrrolidone.

Besides, gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate or benzothiazoles can be effectively used as the smoothing agent.

Examples of the benzothiazoles include benzothiazole, 2-methylbenzothiazole, 2-mercaptobenzothiazole, 2-(methylmercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole and 2-benzothiazole thioacetic acid.

Examples of the brightening agent or the semi-brightening agent, some of which have been mentioned above as the examples of the smoothing agent, include various aldehydes such as benzaldehyde, o-chlorobenzaldehyde, 2,4,6-trichlorobenzaldehyde, m-chlorobenzaldehyde, p-nitrobenzaldehyde, p-hydroxybenzaldehyde, furfural, 1-naphthoaldehyde, 2-naphthoaldehyde, 2-hydroxy-1-naphthoaldehyde, 3-acenaphthoaldehyde, benzylideneacetone (benzalacetone), pyridylideneacetone, furfurylideneacetone, cinnamaldehyde, anisaldehyde, salicylaldehyde, crotonaldehyde, acrolein, glutaraldehyde, paraldehyde and vanillin; and triazine, imidazole, indole, quinoline, 2-vinylpyridine, anillin, phenanthroline, neocuproine, picolinic acid, thioureas, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine and phenyl salicylate; and benzothiazoles such as benzothiazole, 2-methylbenzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole and 5-hydroxy-2-methylbenzothiazole; and saccharin.

The antioxidant is used for purpose of preventing oxidation of $Sn^{2+}$ in the bath, and examples include ascorbic acid or a salt thereof, hydroquinone, catechol, resorcin, phloroglucin, cresol sulfonic acid or a salt thereof, phenol sulfonic acid or a salt thereof, catechol sulfonic acid or a salt thereof, hydroquinone sulfonic acid or a salt thereof, hydroxynaphthalene sulfonic acid or a salt thereof, and hydrazine. For example, in a neutral bath, ascorbic acid or a salt thereof or the like is preferred.

As the pH adjusting agent, various acids such as hydrochloric acid and sulfuric acid, and various bases such as ammonia water, potassium hydroxide and sodium hydroxide, and monocarboxylic acids such as formic acid, acetic acid and propionic acid; boric acids; phosphoric acids; dicarboxylic acids such as oxalic acid and succinic acid; and oxycarboxylic acids such as lactic acid and tartaric acid; and the like are also effective.

Examples of the conductive salt include sodium salts, potassium salts, magnesium salts, ammonium salts, amine salts and the like of sulfuric acid, hydrochloric acid, phosphoric acid, sulfamic acid, sulfonic acid and the like, and the above-described pH adjusting agent may be used also for this purpose in some cases.

Examples of the preservative include boric acid, 5-chloro-2-methyl-4-isothiazolin-3-one, benzalkonium chloride, phenol, phenol polyethoxylate, thymol, resorcin, isopropylamine and guaiacol.

Examples of the antifoaming agent include a Pluronic surfactant, a higher aliphatic alcohol, acetylene alcohol, polyalkoxylates of these, and a silicone-based antifoaming agent.

The tin or tin alloy electroplating bath of the present invention 1 has been described in detail so far, and now, a tin or tin alloy electroplating bath of the present invention 4 will be described.

In comparison of the present invention 4 with the present invention 1, a component (A) and a component (B) of the present invention 4 are the same as those of the present invention 1, and various additives that can be contained in the plating bath are the same as those of the present invention 1.

On the other hand, a branched polyoxyalkylene compound (C) and a complexing agent (D) used in the present invention 4 are different from those of the present invention 1.

First, although an ethylene oxide/propylene oxide adduct (a multiple adduct of both EO and PO) of ethylenediamine is excluded from the alkylene oxide adduct (C2) of aliphatic polyamine in the present invention 1, the branched polyoxyalkylene compound (C) used in the present invention 4 is an ethylene oxide/propylene oxide adduct (C21) of ethylenediamine thus excluded.

Next, as the complexing agent (D) used in the present invention 4, among all the compounds usable as the complexing agent (D) in the present invention 1, specific sulfide compounds (b) to (c), a specific heterocyclic sulfur-containing compound (d1) in which a monocyclic heterocyclic group is partly restricted, oxycarboxylic acid, polycarboxylic acid, aminocarboxylic acid, pyrophosphoric acid, polyamine, amino alcohol and salts of these can be used.

Accordingly, in the present invention 4, the specific sulfide compound (a) in the present invention 1 cannot be used as the complexing agent (D).

Besides, as the complexing agent (D) in the present invention 4, some of the specific heterocyclic sulfur-containing compounds (d) in the present invention 1 are restricted in use, and the others can be used without restriction.

The expression "a monocyclic heterocyclic group is partly restricted" used with respect to the heterocyclic sulfur-containing compound (d) means, when the heterocyclic sulfur-containing compound (d) contains a monocyclic heterocyclic group, that "tetrazole is excluded from the monocyclic heterocyclic group", and hence, a compound in which a sulfide group or a mercapto group is adjacent to a tetrazole ring group is excluded from the heterocyclic sulfur-containing compound (d1) of the present invention 4, and the other compounds are embraced in the compound (d1) of the present invention 4.

In other words, the tin or tin alloy electroplating bath of the present invention 4 essentially uses both two components of the ethylene oxide/propylene oxide adduct (C21) of ethylenediamine and the specific complexing agent (D).

The present invention 6 is an electronic component having an electrodeposit of tin or a tin alloy formed thereon by using the tin or tin alloy electroplating bath of the present invention described above. A representative example of the electrodeposit is a bump electrode (bump) which is formed on a wafer, a substrate, a lead frame or the like. When a large number of bump electrodes are formed by using the tin or tin alloy electroplating bath of the present invention, uniformity in height of the bump electrodes can be satisfactorily obtained.

Another representative example of the electrodeposit is an electrodeposited film. When a large number of electrodeposited films are formed by using the tin or tin alloy electroplating bath of the present invention, the thicknesses of the films can be satisfactorily made uniform, and when used for filling via holes, occurrence of a void (gap) can be smoothly prevented.

The electronic component is selected from a glass substrate, a silicon substrate, a sapphire substrate, a wafer, a printed wiring board, a semiconductor integrated circuit, a resistor, a variable resistor, a capacitor, a filter, an inductor, a thermistor, a crystal oscillator, a switch, a lead wire and a solar cell.

For example, when a bump electrode is formed on a silicon substrate or a wafer by applying the tin or tin alloy electroplating bath of the present invention, the electronic component of the present invention 6 corresponds to the substrate or the wafer on which the bump electrode is formed. Alternatively, when an electrodeposited film is formed on a lead frame or a substrate, the electronic component of the present invention 6 corresponds to the lead frame or the substrate on which the plating film is formed.

In electroplating using the tin or tin alloy electroplating bath of the present invention, any of various plating methods such as barrel plating, rack plating, high-speed continuous plating, rackless plating, cup plating and dip plating can be employed.

As conditions for the electroplating, a plating bath temperature is 0° C. or more, and preferably about 10° C. to 50° C., and a cathode current density is 0.001 A/dm$^2$ to 40 A/dm$^2$, and preferably 0.01 A/dm$^2$ to 25 A/dm$^2$.

After the electroplating, the bump electrode or the electrodeposited film is formed with or without causing reflow of precipitated tin or tin alloy.

EXAMPLES

There will be successively described examples of the tin or tin alloy electroplating bath of the present invention, production examples of bump electrodes formed on semiconductor substrates by electroplating using the plating baths obtained in the examples, and an evaluation test example for formation abnormality suppressing property in a group of a large number of bump electrodes obtained by the production examples.

It is noted that the present invention is not restricted by these examples, production examples and test example, and it goes without saying that the present invention can be arbitrarily modified and changed within a scope of the technical spirit of the present invention.

<<Examples of Tin and Tin Alloy Electroplating Baths>>

Examples 1 to 29 described below are classified in accordance with the type of plating bath as follows.
Examples 1 to 4 and 28: Tin plating bath
Examples 5 to 6: Tin-zinc alloy plating bath
Examples 7 to 14, 27 and 29: Tin-silver alloy plating bath
Examples 15 to 18: Tin-copper alloy plating bath
Examples 19 to 20: Tin-bismuth alloy plating bath
Example 21: Tin-indium alloy plating bath
Example 22: Tin-nickel alloy plating bath
Example 23: Tin-gold alloy plating bath
Example 24: Tin-cobalt alloy plating bath
Example 25: Tin-antimony alloy plating bath
Example 26: Tin-lead alloy plating bath Examples 1 to 29 are classified in accordance with the type of the branched polyoxyalkylene compound (C) used for preparing the plating bath as follows. It is noted that Example 16 relates to the present invention 4 and that the other examples all relate to the present invention 1.

Examples 1 to 2, 6 to 7, 9, 12, 14, 17, 19, 22 to 23 and 25:
Alkylene oxide adduct (C1) of aliphatic monoamine
Examples 3, 8, 13, 21, 26 and 28 to 29:
Alkylene oxide adduct (C2) of aliphatic polyamine
Examples 11 and 15:
Alkylene oxide adduct (C3) of trimethylolpropane
Examples 4, 20, 24 and 27:
Alkylene oxide adduct (C4) of glycerin
Examples 5, 10 and 18:
Alkylene oxide adduct (C5) of polyglycerin
Example 16:
Ethylene oxide/propylene oxide adduct (C21) of ethylenediamine On the other hands, Comparative Examples 1 to 3 are blank examples not containing the branched polyoxyalkylene compound (C) used in the present invention, and specifically, Comparative Example 1 corresponds to an example of a tin plating bath, Comparative Example 2 corresponds to an example of a tin-silver alloy plating bath, and Comparative Example 3 corresponds to an example of a tin-copper alloy plating bath.

Incidentally, the term "C-Cn" (wherein n is an integer of 1 to 5 or n is 21) used in each of the following examples is an abbreviation of a compound Cn (wherein n is an integer of 1 to 5 or n is 21), and is used to indicate which of the compounds (C1) to (C5) and (C21) the branched polyoxyalkylene compound (C) used in the corresponding example is classified into.

(1) Example 1

A tin electroplating bath having the following composition was prepared.
Stannous methanesulfonate (in terms of Sn$^{2+}$): 80 g/L
Methanesulfonic acid (used as free acid): 100 g/L
Bisphenol A polyoxyethylene (EO 13 mol): 10 g/L
Polyoxyethylene polyoxypropylene-laurylamine (EO 5 mol/PO 10 mol) (C-C1): 2 g/L
Potassium hydroquinone sulfonate: 2 g/L
Isopropyl alcohol: 2 g/L
[Plating Conditions]
Bath temperature: 30° C.
Cathode current density: 8 A/dm$^2$

(2) Example 2

A tin electroplating bath having the following composition was prepared.
Stannous methanesulfonate (in terms of $Sn^{2+}$): 65 g/L
Methanesulfonic acid (used as free acid): 100 g/L
Styrenated phenol polyethoxylate (EO 20 mol): 10 g/L
Benzyltrimethyl ammonium hydroxide: 1 g/L
Catechol sulfonic acid: 2.5 g/L
Polyoxyethylene polyoxypropylene-butylamine (EO 8 mol/PO 12 mol) (C-C1): 2 g/L
[Plating Conditions]
Bath temperature: 30° C.
Cathode current density: 10 A/dm$^2$

(3) Example 3

A tin electroplating bath having the following composition was prepared.
Stannous methanesulfonate (in terms of $Sn^{2+}$): 50 g/L
Methanesulfonic acid (used as free acid): 100 g/L
Cumylphenol polyethoxylate (EO 6 mol): 5 g/L
Catechol sulfonic acid: 2.5 g/L
Polyoxyethylene polyoxypropylene-diethylenetriamine (EO 40 mol/PO 25 mol) (C-C2): 1 g/L
[Plating Conditions]
Bath temperature: 25° C.
Cathode current density: 3 A/dm$^2$

(4) Example 4

A tin electroplating bath having the following composition was prepared.
Stannous methanesulfonate (in terms of $Sn^{2+}$): 85 g/L
Methanesulfonic acid (used as free acid): 80 g/L
Lauryl dimethyl ethyl ammonium ethyl sulfate: 5 g/L
Benzalacetone: 2 g/L
Methoxycatechol: 3 g/L
Isopropyl alcohol: 2 g/L
Polyoxyethylene polyoxypropylene-glycerol ether (EO 30 mol/PO 10 mol) (C-C4): 1 g/L
[Plating Conditions]
Bath temperature: 30° C.
Cathode current density: 8 A/dm$^2$

(5) Example 5

A tin-zinc alloy electroplating bath having the following composition was prepared.
Stannous methanesulfonate (in terms of $Sn^{2+}$): 45 g/L
Zinc chloride (in terms of $Zn^{2+}$): 25 g/L
Gluconic acid: 100 g/L
Methanesulfonic acid (used as free acid): 50 g/L
Poly(diallylamine) polymer: 0.5 g/L
Sodium alkyldiphenyl ether disulfonate: 0.2 g/L
Polyoxyethylene-polyglyceryl ether (EO 30 mol) (C-C5): 1 g/L
Sodium hydroxide: q.s. (for adjustment to pH=5)
[Plating Conditions]
Bath temperature: 25° C.
Cathode current density: 2 A/dm$^2$

(6) Example 6

A tin-zinc alloy electroplating bath having the following composition was prepared.
Stannous methanesulfonate (in terms of $Sn^{2+}$): 40 g/L
Zinc methanesulfonate (in terms of $Zn^{2+}$): 60 g/L
Citric acid: 100 g/L
Methanesulfonic acid (used as free acid): 100 g/L
Trimethyl benzyl ammonium chloride: 3 g/L
Polyoxyethylene polyoxypropylene-oleylamine (EO 15 mol/PO 5 mol) (C-C1): 0.5 g/L
Ammonia water: q.s. (for adjustment to pH=5)
[Plating Conditions]
Bath temperature: 25° C.
Cathode current density: 2 A/dm$^2$

(7) Example 7

A tin-silver alloy electroplating bath having the following composition was prepared.
Stannous methanesulfonate (in terms of $Sn^{2+}$): 60 g/L
Silver methanesulfonate (in terms of $Ag^+$): 0.8 g/L
Methanesulfonic acid (used as free acid): 150 g/L
1-(2-Dimethylaminoethyl)-5-mercaptotetrazole: 2 g/L
3,6-Dithiaoctane-1,8-diol: 2 g/L
Polyoxyethylene polyoxypropylene-coconut oil amine (EO 10 mol/PO 10 mol) (C-C1): 2 g/L
Hydroquinone: 0.5 g/L
[Plating Conditions]
Bath temperature: 30° C.
Cathode current density: 10 A/dm$^2$

(8) Example 8

A tin-silver alloy electroplating bath having the following composition was prepared.
Stannous methanesulfonate (in terms of $Sn^{2+}$): 80 g/L
Silver methanesulfonate (in terms of $A^+$): 0.6 g/L
Methanesulfonic acid (used as free acid): 200 g/L
4,7-Dithiadecane-1,10-diol: 5 g/L
Potassium hydroquinone sulfonate: 2 g/L
Benzalacetone: 0.05 g/L
Isopropyl alcohol: 2 g/L
Polyoxyethylene polyoxypropylene-diethylenetriamine (EO 40 mol/PO 25 mol) (C-C2): 1.5 g/L
[Plating Conditions]
Bath temperature: 35° C.
Cathode current density: 15 A/dm$^2$

(9) Example 9

A tin-silver alloy electroplating bath having the following composition was prepared.
Stannous methanesulfonate (in terms of $Sn^{2+}$): 70 g/L
Silver methanesulfonate (in terms of $A^+$): 0.5 g/L
Methanesulfonic acid (used as free acid): 180 g/L
Thiobis(dodecaethylene glycol): 120 g/L
Hydroquinone sulfonic acid: 1.5 g/L
Polyoxyethylene polyoxypropylene-glycol (EO 15 mol/PO 35 mol): 1.0 g/L
Polyoxyethylene polyoxypropylene-laurylamine (EO 5 mol/PO 10 mol) (C-C1): 2.0 g/L
[Plating Conditions]
Bath temperature: 25° C.
Cathode current density: 10 A/dm$^2$

(10) Example 10

A tin-silver alloy electroplating bath having the following composition was prepared.
  Stannous methanesulfonate (in terms of $Sn^{2+}$): 65 g/L
  Silver methanesulfonate (in terms of $A^+$): 0.6 g/L
  Methanesulfonic acid (used as free acid): 200 g/L
  1,10-Diamino-4,7-dithiadecane: 10 g/L
  Dimethyl benzyl lauryl ammonium sulfonate: 1 g/L
  Sodium alkyldiphenyl ether disulfonate: 0.5 g/L
  Aminocatechol: 2 g/L
  Polyoxypropylene-polyglyceryl ether (PO 15 mol) (C-C5): 8 g/L
[Plating Conditions]
Bath temperature: 30° C.
Cathode current density: 10 A/dm$^2$

(11) Example 11

A tin-silver alloy electroplating bath having the following composition was prepared.
  Stannous hydroxyethanesulfonate (in terms of $Sn^{2+}$): 80 g/L
  Silver hydroxyethanesulfonate (in terms of $A^+$): 1.5 g/L
  Hydroxyethanesulfonic acid (used as free acid): 80 g/L
  1-(m-Sulfophenyl)-5-mercapto-1H-tetrazole sodium salt: 5 g/L
  3,6-Dithiaoctane-1,8-diol: 5 g/L
  Bisphenol E polyethoxylate (EO 15 mol): 5 g/L
  Catechol sulfonic acid: 2 g/L
  Triethylolpropane tripolyoxyethylene-polyoxypropylene ether (EO 15 mol/PO 3 mol) (C-C3): 5 g/L
[Plating Conditions]
Bath temperature: 30° C.
Cathode current density: 10 A/dm$^2$

(12) Example 12

A tin-silver alloy electroplating bath having the following composition was prepared.
  Stannous methanesulfonate (in terms of $Sn^{2+}$): 50 g/L
  Silver methanesulfonate (in terms of $A^+$): 0.3 g/L
  Methanesulfonic acid (used as free acid): 200 g/L
  Thiobis(dodecaethylene glycol): 80 g/L
  Cumylphenol polyethoxylate (EO 10 mol): 5 g/L
  Lauryl trimethyl ammonium sulfate: 5 g/L
  Catechol sulfonic acid: 2 g/L
  Polyoxyethylene polyoxypropylene-glycol (EO 15 mol/PO 35 mol): 1.0 g/L
  Polyoxyethylene polyoxypropylene-dodecylamine (EO 10 mol/PO 5 mol) (C-C1): 3 g/L
[Plating Conditions]
Bath temperature: 25° C.
Cathode current density: 10 A/dm$^2$

(13) Example 13

A tin-silver alloy electroplating bath having the following composition was prepared.
  Stannous methanesulfonate (in terms of $Sn^{2+}$): 50 g/L
  Silver methanesulfonate (in terms of $A^+$): 0.5 g/L
  Methanesulfonic acid (used as free acid): 80 g/L
  Dithioditriazole: 2.5 g/L
  4,7-Dithiadecane-1,10-diol: 1 g/L
  Bisphenol F polyethoxylate (EO 20 mol): 10 g/L
  Methylhydroquinone: 1 g/L
  Polyoxyethylene polyoxypropylene-propylenediamine (EO 30 mol/PO 35 mol) (C-C2): 2 g/L
[Plating Conditions]
Bath temperature: 25° C.
Cathode current density: 8 A/dm$^2$

(14) Example 14

A tin-silver alloy electroplating bath having the following composition was prepared.
  Stannous methanesulfonate (in terms of $Sn^{2+}$): 60 g/L
  Silver methanesulfonate (in terms of $A^+$): 0.7 g/L
  Methanesulfonic acid (used as free acid): 100 g/L
  Thiobis(decaethylene glycol): 100 g/L
  Polyoxyethylene polyoxypropylene lauryl ether: 2 g/L
  Octyl dimethyl ethyl ammonium ethyl sulfate: 1 g/L
  Sodium hydroquinone sulfonate: 2 g/L
  Polyoxyethylene polyoxypropylene-alkyl (C8-C18) amine (EO 8 mol/PO 12 mol) (C-C1): 5 g/L
[Plating Conditions]
Bath temperature: 30° C.
Cathode current density: 8 A/dm$^2$

(15) Example 15

A tin-copper alloy electroplating bath having the following composition was prepared.
  Stannous methanesulfonate (in terms of $Sn^{2+}$): 60 g/L
  Copper methanesulfonate (in terms of $Cu^{2+}$): 1 g/L
  Methanesulfonic acid (used as free acid): 120 g/L
  Thiodiglycolic acid: 8 g/L
  Bisphenol A polyethoxylate (EO 10 mol): 10 g/L
  N-Dimethyl phenyl ammonium methyl sulfate: 0.5 g/L
  Pyrogallol: 2 g/L
  Trimethylolpropane tripolyoxyethylene-polyoxypropylene ether (EO 30 mol/PO 12 mol) (C-C3): 4 g/L
[Plating Conditions]
Bath temperature: 30° C.
Cathode current density: 4 A/dm$^2$

(16) Example 16

A tin-copper alloy electroplating bath having the following composition was prepared.
  Stannous methanesulfonate (in terms of $Sn^{2+}$): 50 g/L
  Copper methanesulfonate (in terms of $Cu^{2+}$): 0.7 g/L
  Methanesulfonic acid (used as free acid): 120 g/L
  Thiodiglycol: 10 g/L
  Lauryl phenol polyethoxylate: 5 g/L
  Sodium hydroquinone sulfonate: 2 g/L
  Sodium diphenyl ether disulfonate: 1 g/L
  Polyoxyethylene polyoxypropylene-ethylenediamine (EO 30 mol/PO 35 mol) (C-C21): 1.5 g/L
[Plating Conditions]
Bath temperature: 25° C.
Cathode current density: 4 A/dm$^2$

(17) Example 17

A tin-copper alloy electroplating bath having the following composition was prepared.
  Stannous methanesulfonate (in terms of $Sn^{2+}$): 80 g/L
  Copper methanesulfonate (in terms of $Cu^{2+}$): 1.0 g/L
  Methanesulfonic acid (used as free acid): 150 g/L
  5-Mercapto-1-phenyl-1H-tetrazole: 7 g/L
  Polyoxyethylene styrenated phenyl ether: 5 g/L
  Methylcatechol: 5 g/L Polyoxyethylene polyoxypropylene-beef tallow alkylamine (EO 7 mol/PO 10 mol) (C-C1): 2 g/L
[Plating Conditions]
Bath temperature: 25° C.
Cathode current density: 8 A/dm²

(18) Example 18

A tin-copper alloy electroplating bath having the following composition was prepared.
Stannous methanesulfonate (in terms of $Sn^{2+}$): 50 g/L
Copper methanesulfonate (in terms of $Cu^{2+}$): 0.7 g/L
Methanesulfonic acid (used as free acid): 120 g/L
Thiodiglycol: 10 g/L
Bisphenol A polyethoxylate (EO 13 mol): 5 g/L
Ammonium alkyl diphenyl ether disulfonate: 1 g/L
Polyoxyethylene polyoxypropylene-polyglyceryl ether (EO 15 mol/PO 15 mol) (C-C5): 1 g/L
Potassium hydroquinone sulfonate: 2 g/L
[Plating Conditions]
Bath temperature: 25° C.
Cathode current density: 2 A/dm²

(19) Example 19

A tin-bismuth alloy electroplating bath having the following composition was prepared.
Stannous methanesulfonate (in terms of $Sn^{2+}$): 15 g/L
Bismuth methanesulfonate (in terms of $Bi^{3+}$): 60 g/L
Methanesulfonic acid (used as free acid): 100 g/L
2-Amino-5-mercapto-1,3,4-thiadiazole: 10 g/L
Octyl phenyl ether polyethoxylate (EO 20 mol): 10 g/L
Catechol sulfonic acid: 2 g/L
Polyoxyethylene coconut oil alkylamine (EO 10 mol) (C-C1): 3 g/L
[Plating Conditions]
Bath temperature: 30° C.
Cathode current density: 3 A/dm²

(20) Example 20

A tin-bismuth alloy electroplating bath having the following composition was prepared.
Stannous methanesulfonate (in terms of $Sn^{2+}$): 20 g/L
Bismuth methanesulfonate (in terms of $Bi^{3+}$): 50 g/L
Methanesulfonic acid (used as free acid): 90 g/L
5-Mercapto-1-methyltetrazole: 10 g/L
Condensate of sodium naphthalenesulfonate and formaldehyde: 7 g/L
Catechol sulfonic acid: 3 g/L
Polyoxyethylene polyoxypropylene-glyceryl ether (EO 30 mol/PO 6 mol) (C-C4): 1 g/L
[Plating Conditions]
Bath temperature: 40° C.
Cathode current density: 4.5 A/dm²

(21) Example 21

A tin-indium alloy electroplating bath having the following composition was prepared.
Stannous methanesulfonate (in terms of $Sn^{2+}$): 2 g/L
Indium methanesulfonate (in terms of $In^{3+}$): 30 g/L
Citric acid: 200 g/L
Poly(diallylamine) polymer: 0.5 g/L
Sodium diphenyl ether disulfonate: 0.2 g/L
Ethylenediamine polyoxypropylene (PO 4 mol) (C-C2): 0.5 g/L
Sodium hydroxide: q.s. (for adjustment to pH=6)
[Plating Conditions]
Bath temperature: 55° C.
Cathode current density: 1.5 A/dm²

(22) Example 22

A tin-nickel alloy electroplating bath having the following composition was prepared.
Stannous chloride (in terms of $Sn^{2+}$): 30 g/L
Nickel chloride (in terms of $Ni^{2+}$): 60 g/L
Glycine: 75 g/L
Sodium diphenyl ether disulfonate: 0.1 g/L
Polyoxyethylene polyoxypropylene-octylamine (EO 10 mol/PO 5 mol) (C-C1): 1.0 g/L
Sodium hydroxide: q.s. (for adjustment to pH=7)
[Plating Conditions]
Bath temperature: 55° C.
Cathode current density: 1.5 A/dm²

(23) Example 23

A tin-gold alloy electroplating bath having the following composition was prepared.
Stannous methanesulfonate (in terms of $Sn^{2+}$): 50 g/L
Gold potassium sulfite (in terms of $A^+$): 8 g/L
Gluconic acid: 100 g/L
Sodium diphenylamine disulfonate: 0.2 g/L
Polyoxyethylene polyoxypropylene-stearylamine (EO 13 mol/PO 5 mol) (C-C1): 0.2 g/L
Potassium hydroxide: q.s. (for adjustment to pH=8)
[Plating Conditions]
Bath temperature: 35° C.
Cathode current density: 1 A/dm²

(24) Example 24

A tin-cobalt alloy electroplating bath having the following composition was prepared.
Stannous chloride (in terms of $Sn^{2+}$): 25 g/L
Cobalt chloride (in terms of $Co^{2+}$): 60 g/L
Hydrochloric acid: 10 g/L
Sodium gluconate: 120 g/L
Sodium benzyl phenyl disulfonate: 0.25 g/L
Polyoxyethylene glycerol ether (EO 15 mol) (C-C4): 0.5 g/L
Sodium hydroxide: q.s. (for adjustment to pH=2.0)
[Plating Conditions]
Bath temperature: 50° C.
Cathode current density: 1.5 A/dm²

(25) Example 25

A tin-antimony alloy electroplating bath having the following composition was prepared.
Stannous 1-hydroxyethane-1,1-disulfonate (in terms of $Sn^{2+}$): 40 g/L
Antimony 1-hydroxyethane-1,1-disulfonate (in terms of $Sb^{3+}$): 8 g/L
1-Hydroxyethane-1,1-disulfonic acid (used as free acid): 150 g/L
Lauryl phenyl ether polyethoxylate (EO 10 mol): 0.1 g/L
Catechol: 3 g/L
Sodium diphenyl ether disulfonate: 0.2 g/L
Polyoxyethylene polyoxypropylene-cetylamine (EO 15 mol/PO 5 mol) (C-C1): 0.5 g/L
Sodium hydroxide: q.s. (for adjustment to pH=2.0)

(26) Example 26

A tin-lead alloy electroplating bath having the following composition was prepared.
Stannous methanesulfonate (in terms of $Sn^{2+}$): 60 g/L
Lead methanesulfonate (in terms of $Pb^{2+}$): 30 g/L
Methanesulfonic acid: 100 g/L
Bisphenol A polyethoxylate (EO 13 mol): 10 g/L
Alkyl poly(diallylamine) polymer: 0.5 g/L
Polyoxyethylene polyoxypropylene-stearyl propylenediamine (EO 12 mol/PO 9 mol) (C-C2): 0.2 g/L
[Plating Conditions]
Bath temperature: 25° C.
Cathode current density: 5 A/dm²

(27) Example 27

A tin-silver alloy electroplating bath having the following composition was prepared.
Stannous methanesulfonate (in terms of $Sn^{2+}$): 60 g/L
Silver methanesulfonate (in terms of $A^+$): 0.8 g/L
Methanesulfonic acid (used as free acid): 150 g/L
Thiourea: 5 g/L
Polyoxyethylene polyoxypropylene-glyceryl ether (EO 30 mol/PO 6 mol) (C-C4): 2 g/L
Hydroquinone: 0.5 g/L
[Plating Conditions]
Bath temperature: 30° C.
Cathode current density: 10 A/dm²

(28) Example 28

A tin electroplating bath having the following composition was prepared.
Stannous methanesulfonate (in terms of $Sn^{2+}$): 85 g/L
Methanesulfonic acid (used as free acid): 200 g/L
Cumylphenol polyoxyethylene (EO 10 mol): 5 g/L
Lauryl dimethyl ethyl ammonium ethyl sulfate: 5 g/L
Potassium hydroquinone sulfonate: 0.5 g/L
Polyoxypropylene ethylenediamine (PO 4 mol) (C-C2): 1 g/L
[Plating Conditions]
Bath temperature: 30° C.
Cathode current density: 8 A/dm²

(29) Example 29

A tin-silver alloy electroplating bath having the following composition was prepared.
Stannous hydroxyethanesulfonate (in terms of $Sn^{2+}$): 80 g/L
Silver hydroxyethanesulfonate (in terms of Ag±): 1.5 g/L
Hydroxyethanesulfonic acid (used as free acid): 80 g/L
1-(m-Sulfophenyl)-5-mercapto-1H-tetrazole sodium salt: 5 g/L
3,6-Dithiaoctane-1,8-diol: 5 g/L
Bisphenol E polyethoxylate (EO 15 mol): 5 g/L
Catechol sulfonic acid: 2 g/L
Polyoxyethylene ethylenediamine (EO 20 mol) (C-C2): 2 g/L
[Plating Conditions]
Bath temperature: 30° C.
Cathode current density: 10 A/dm²

(30) Comparative Example 1

This is an example based on Example 1 but not containing the branched polyoxyalkylene compound (C) used in the present invention. Specifically, a tin electroplating bath having the following composition was prepared.
Stannous methanesulfonate (in terms of $Sn^{2+}$): 80 g/L
Methanesulfonic acid (used as free acid): 100 g/L
Bisphenol A polyoxyethylene: 10 g/L
Potassium hydroquinone sulfonate: 2 g/L
Isopropyl alcohol: 2 g/L
[Plating Conditions]
Bath temperature: 30° C.
Cathode current density: 8 A/dm²

(31) Comparative Example 2

This is an example based on Example 7 but not containing the branched polyoxyalkylene compound (C) used in the present invention. Specifically, a tin-silver alloy electroplating bath having the following composition was prepared.
Stannous methanesulfonate (in terms of $Sn^{2+}$): 60 g/L
Silver methanesulfonate (in terms of $A^+$): 0.8 g/L
Methanesulfonic acid (used as free acid): 150 g/L
1-(2-Dimethylaminoethyl)-5-mercaptotetrazole: 2 g/L
3,6-Dithiaoctane-1,8-diol: 2 g/L
Bisphenol A polyethoxylate (EO 13 mol): 10 g/L
Hydroquinone: 0.5 g/L
[Plating Conditions]
Bath temperature: 30° C.
Cathode current density: 10 A/dm²

(32) Comparative Example 3

This is an example based on Example 17 but not containing the branched polyoxyalkylene compound (C) used in the present invention. Specifically, a tin-copper alloy electroplating bath having the following composition was prepared.
Stannous methanesulfonate (in terms of $Sn^{2+}$): 80 g/L
Copper methanesulfonate (in terms of $Cu^{2+}$): 1.0 g/L
Methanesulfonic acid (used as free acid): 150 g/L
5-Mercapto-1-phenyl-1H-tetrazole: 7 g/L
Polyoxyethylene styrenated phenyl ether: 5 g/L
Methyl catechol: 5 g/L
[Plating Conditions]
Bath temperature: 25° C.
Cathode current density: 8 A/dm²

Next, each of the tin or tin alloy electroplating baths of Examples 1 to 29 and Comparative Examples 1 to 3 was used to form a large number of bump electrodes for evaluating the number of abnormally precipitated bump electrodes.

<<Examples of Forming Bump Electrodes by Electroplating>>

The electroplating was performed (under the plating conditions mentioned at the end of a corresponding one of the examples and the comparative examples) for forming, on a substrate, a group (of about 5000) of bump electrodes by using each of the tin or tin alloy electroplating baths of Examples 1 to 29 and Comparative Examples 1 to 3.

<<Evaluation Test Example for Uniformity in Height of Bump Electrodes (Property of Suppressing Abnormal Precipitation)>>

In a large number of bump electrodes formed on a silicon substrate by the electroplating using the tin or tin alloy plating bath, the number of abnormally grown bump electrodes was counted. The thus obtained counted value was used to calculate a ratio A (%) of abnormally precipitated bump electrodes in accordance with the following expression (p), and superiority or inferiority in occurrence frequency of the abnormal precipitation was quantitatively evaluated. In this case, abnormal growth of a bump electrode was determined depending on whether or not the height of the bump electrode exceeds ±30% of an average film thickness, and the property of suppressing abnormal precipitation was evaluated based on the following evaluation criteria.

A=N(abn)/N(all)×100 (p)
N(abn): Number of abnormally grown bump electrodes
N(all): Total number of bump electrodes
[Evaluation Criteria]
⊚: The ratio A was less than 0.1%.
○: The ratio A was 0.1% or more and less than 0.25%.
Δ: The ratio A was 0.25% or more and less than 0.5%.
x: The ratio A was 0.5% or more.
The results are shown in Table 1 below.

TABLE 1

| | Property of suppressing abnormal precipitation |
|---|---|
| Example 1 | ⊚ |
| Example 2 | ⊚ |
| Example 3 | ○ |
| Example 4 | ○ |
| Example 5 | ⊚ |
| Example 6 | ⊚ |
| Example 7 | ⊚ |
| Example 8 | ○ |
| Example 9 | ○ |
| Example 10 | ⊚ |
| Example 11 | ⊚ |
| Example 12 | ⊚ |
| Example 13 | ⊚ |
| Example 14 | ○ |
| Example 15 | ○ |
| Example 16 | ○ |
| Example 17 | ○ |
| Example 18 | ⊚ |
| Example 19 | ○ |
| Example 20 | ○ |
| Example 21 | ○ |
| Example 22 | ○ |
| Example 23 | Δ |
| Example 24 | Δ |
| Example 25 | ○ |
| Example 26 | ○ |
| Example 27 | Δ |
| Example 28 | ⊚ |
| Example 29 | ⊚ |
| Com. Ex. 1 | X |
| Com. Ex. 2 | X |
| Com. Ex. 3 | X |

<<Evaluation of Test Results>>

(1) Tin Electroplating Bath

First, regarding the tin electroplating bath, Comparative Example 1 is a blank example not containing the branched polyoxyalkylene compound (C) used in the present invention, and comparing Comparative Example 1 with Examples 1 to 4 and 28 containing the compound (C), Examples 1 to 4 and 28 were evaluated as the code "⊚" or "○" while Comparative Example 1 was evaluated as the code "x".

In particular, although Example 1 and Comparative Example 1 are equivalent except whether or not the compound (C1) is used as the branched polyoxyalkylene compound (C), Examples 1 was evaluated as the code "⊚" while Comparative Example 1 was evaluated as the code "x", and thus, it was confirmed that Example 1 was remarkably effective as compared with Comparative Example 1.

(2) Tin-Silver Alloy Electroplating Bath

Regarding the tin-silver alloy electroplating bath, Comparative Example 2 is a blank example not containing the branched polyoxyalkylene compound (C) used in the present invention, and comparing Comparative Example 2 with Examples 7 to 14 and 29 containing the compound (C), Examples 7 to 14 and 29 were evaluated as the code "⊚" or "○" while Comparative Example 2 was evaluated as the code "x".

In particular, although Example 7 and Comparative Example 2 are equivalent except whether or not the compound (C1) is used as the branched polyoxyalkylene compound (C), Example 7 was evaluated as the code "⊚" while Comparative Example 2 was evaluated as the code "x", and thus, it was confirmed that Example 7 was remarkably effective as compared with Comparative Example 2.

Incidentally, although Example 27 is an example of the tin-silver alloy plating bath, it was evaluated as the code "Δ" probably because the complexing agent (D) is not used together with the branched polyoxyalkylene compound (C).

(3) Tin-Copper Alloy Electroplating Bath

Regarding the tin-copper alloy electroplating bath, Comparative Example 3 is a blank example not containing the branched polyoxyalkylene compound (C) used in the present invention, and comparing Comparative Example 3 with Examples 15 to 18 containing the compound (C), Examples 15 to 18 were evaluated as the code "⊚" or "○" while Comparative Example 3 was evaluated as the code "x".

In particular, although Example 17 and Comparative Example 3 are equivalent except whether or not the compound (C1) is used as the branched polyoxyalkylene compound (C), Example 17 was evaluated as the code "○" while Comparative Example 3 was evaluated as the code "x", and thus, it was confirmed that Example 17 was effective as compared with Comparative Example 3.

(4) Evaluation of Tin and Tin Alloy Electroplating Baths

Summarizing (1) to (3) described above, when the branched polyoxyalkylene compound (C) was contained in a tin or prescribed tin alloy plating bath, the resultant bath was found to be obviously superior in suppression of the occurrence of abnormal precipitation as compared with a case where the compound (C) was not contained.

Besides, many of the tin alloy plating baths of a tin-bismuth alloy, a tin-indium alloy, a tin-zinc alloy, a tin-nickel alloy and the like, different from those described in the above (1) to (3), were also evaluated as the code "⊚" or "○", and therefore, it can be presumed that the compound (C) is effective also in these tin alloy plating baths.

Incidentally, the plating baths evaluated as the code "Δ" may be employed without causing any practical problem, and as described above, when the complexing agent (D) is used together as in Example 27 or when a combination of the compound (C) and the complexing agent (D) is considered, these plating baths will be probably improved to be evaluated as the code "⊚" or "○".

Accordingly, when a group of a large number of bump electrodes are formed by using the tin or tin alloy electroplating bath of the present invention containing the branched polyoxyalkylene compound (C), a shape defect that some electrodes are formed in an abnormally large or small size, or a failure of occurrence of unplating can be smoothly suppressed, and thus, the yield can be satisfactorily improved from the viewpoint of quality control.

Examples 1 to 29 will be examined in detail.

With regard to the effectiveness of the function to suppress the formation defect such as abnormal growth, depending on the type of the branched polyoxyalkylene compound (C) added to the plating bath, many of the plating baths are evaluated as the code "⊚" or "○" no matter which of the alkylene oxide adducts (C1) to (C2) of aliphatic monoamine or polyamine, the alkylene oxide adduct (C3) of trimethylolpropane, and the alkylene oxide adducts (C4) to (C5) of glycerin or polyglycerin is used. Based on this, it can be determined that the addition of these compounds (C1) to (C5) to a tin or tin alloy plating bath results in an excellent function to suppress abnormal growth and the like in forming a large number of bump electrodes or the like.

Besides, Example 16 relates to the present invention 4, and it is thus understood that a combination of the ethylene oxide/propylene oxide adduct (C21) of ethylenediamine and the prescribed complexing agent (D) can effectively suppress the formation defect such as abnormal growth. And it is understood that a plating bath excellent in the function to suppress the formation defect such as abnormal growth can be obtained also by using a single adduct of ethylene oxide of ethylenediamine or a single adduct of propylene oxide thereof.

When a tin or tin alloy electroplating bath of the present invention is used, formation defect such as abnormal growth is suppressed, and a large number of electrodeposits (such as bump electrodes and electrodeposited films) capable of assuring satisfactory improvement of the yield from the viewpoint of quality control can be formed.

What is claimed is:

1. A tin or tin alloy electroplating bath, comprising:
(A) a soluble salt of a stannous salt or a mixture of a stannous salt and a salt of at least one metal selected from the group consisting of zinc, nickel, bismuth, cobalt, indium, antimony, gold, silver, copper and lead;
(B) an acid or a salt thereof;
(C) at least one branched polyoxyalkylene compound selected from the group consisting of the following compounds (C3), (C4) and (C5):
(C3) an alkylene oxide adduct of trimethylolalkane or triethylolalkane in which oxyalkylene chains are respectively bonded to a plurality of oxygen atoms of an alcohol structure in a molecule;
(C4) an alkylene oxide adduct of glycerin in which oxyalkylene chains are respectively bonded to a plurality of oxygen atoms of an alcohol structure in a molecule; and
(C5) an alkylene oxide adduct of polyglycerin in which oxyalkylene chains are respectively bonded to a plurality of oxygen atoms of an alcohol structure in a molecule; and
(D) at least one complexing agent selected from
(i) a sulfide compound selected from the following compound (a), compound (b) and compound (c);
(ii) a heterocyclic sulfur-containing compound corresponding to the following compound (d); and
(iii) salts thereof:
(a) an aliphatic sulfide compound represented by the following formula (a): $X_n$—$R^1$—S—$(CH_2CH_2S)_m$—$R^2$—$X_n$ (a)
in which $R^1$ and $R^2$ are C2-C4 alkylene; X is selected from $NR^aR^b$ in which $R^a$ and $R^b$ are C1-C6 alkyl, and $CONR^aR^b$ in which $R^a$ and $R^b$ are hydrogen or C1-C6 alkyl, and may be bonded to any carbon atom in an alkylene chain included in $R^1$ and $R^2$; m is 2; and n is an integer of 1 to 4;
(b) an aliphatic sulfide compound represented by the following formula (b): H—$(OA)_n$-S—$(OA)_n$-H (b)
in which A is ethylene or propylene with a hydroxyl group optionally bonded to a carbon atom included in an ethylene or propylene chain; and n is an integer of 1 to 25;
(c) an aromatic sulfide compound having one or repeated mono-, di- or trisulfide bond, and having one or more basic nitrogen atoms in at least one of atom groups disposed on both sides of the bond and selected from aliphatic, alicyclic, aromatic ring and heterocyclic atoms; and
(d) a heterocyclic sulfur-containing compound that has a monocyclic heterocyclic group or a fused heterocyclic group containing 1 to 5 atoms of at least one selected from nitrogen, sulfur and oxygen, excluding pyridine, morpholine, benzimidazole, benzothiazole and benzoxazole ring groups, and the monocyclic heterocyclic group or the fused heterocyclic group being any one of heterocyclic groups selected from tetrazole, triazole, thiazole, thiadiazole, imidazole, quinoline, furan, morpholine, thiophene, pyridine, oxazole, oxadiazole, pyrrole, pyrazole, pyrazine, isothiazole, isoxazole, pyrazolidine, pyrimidine, pyridazine, pyrrolidine, indolizine, indole, isoindole, indazole, purine, isoquinoline, naphthyridine, quinoxaline, carbazole, phenanthroline, phenazine, phenothiazine, phenoxazine, phenanthridine, pyrroline, imidazolidine, pyrazoline, imidazoline, piperidine, piperazine, indoline and thianthrene, and that has a sulfide group or a mercapto group bonded adjacently to the heterocyclic group.

2. The tin or tin alloy electroplating bath according to claim 1, wherein regarding the branched polyoxyalkylene compound (C),
the compound (C3) is trimethylolpropane tripolyoxyethylene ether,
the compound (C4) is polyoxypropylene glycerol ether, and
the compound (C5) is polyoxypropylene polyglyceryl ether.

3. The tin or tin alloy electroplating bath according to claim 1, further comprising at least one additive selected from a surfactant, an antioxidant, a brightening agent, a semi-brightening agent, a pH adjusting agent and an antifoaming agent.

4. The tin or tin alloy electroplating bath according to claim 1, wherein the at least one complexing agent is the aliphatic sulfide compound (a).

* * * * *